United States Patent
Kanamitsu et al.

(10) Patent No.: US 7,524,729 B2
(45) Date of Patent: Apr. 28, 2009

(54) METHOD OF MANUFACTURING A SEMICONDUCTOR INTEGRATED CIRCUIT DEVICE HAVING A TRENCH

(75) Inventors: Kenji Kanamitsu, Hitachinaka (JP); Kouzou Watanabe, Kokubunji (JP); Norio Suzuki, Mito (JP); Norio Ishitsuka, Niihari (JP)

(73) Assignee: Renesas Technology Corp., Tokyo (JP)

( * ) Notice: Subject to any disclaimer, the term of this patent is extended or adjusted under 35 U.S.C. 154(b) by 367 days.

(21) Appl. No.: 11/189,833

(22) Filed: Jul. 27, 2005

(65) Prior Publication Data

US 2005/0260820 A1    Nov. 24, 2005

Related U.S. Application Data

(60) Continuation of application No. 10/919,432, filed on Aug. 17, 2004, now Pat. No. 6,967,141, which is a division of application No. 10/270,188, filed on Oct. 15, 2002, now abandoned, which is a division of application No. 09/473,297, filed on Dec. 28, 1999, now Pat. No. 6,544,839.

(30) Foreign Application Priority Data

Dec. 28, 1998    (JP)    ................... 10-374881

(51) Int. Cl.
*H01L 21/76*    (2006.01)
*H01L 21/336*    (2006.01)

(52) U.S. Cl. ...................... 438/296; 438/426; 438/443; 438/444; 438/437; 438/756

(58) Field of Classification Search ................. 438/289, 438/294–297, 424–426, 435, 437, 439, 443, 438/723, 736, 739, 743, 756, 444
See application file for complete search history.

(56) References Cited

U.S. PATENT DOCUMENTS 4,599,789 A    7/1986    Gasner (Continued)

FOREIGN PATENT DOCUMENTS

DE    19833955    7/1999

(Continued)

OTHER PUBLICATIONS

A Shallow Trench Isolation using LOCOS Edge for Preventing Corner Effects for 0.25/0.18 μm CMOS Technologies and Beyond, A. Chatterjee, D. Rogers, J. McKee, I. Ali, S. Nag and I.C. Chen, 1996 IEEE, pp. 828-833.

(Continued)

*Primary Examiner*—M. Wilczewski
*Assistant Examiner*—Toniae M. Thomas
(74) *Attorney, Agent, or Firm*—Antonelli, Terry, Stout & Kraus, LLP.

(57) ABSTRACT

A semiconductor integrated circuit device and a method of manufacturing the same. The surface of a substrate of an active region surrounded by an element isolation trench is horizontally flat in the center portion of the active region but falls toward the side wall of the element isolation trench in the shoulder portion of the active region. This inclined surface contains two inclined surfaces having different inclination angles. The first inclined surface near the center portion of the active region is relatively steep and the second inclined surface near the side wall of the element isolation trench is gentler than the first inclined surface. The surface of the substrate in the shoulder portion of the active region is wholly rounded and has no angular portion.

46 Claims, 24 Drawing Sheets

U.S. PATENT DOCUMENTS

| | | |
|---|---|---|
| 5,298,450 A | 3/1994 | Verret |
| 5,358,891 A | 10/1994 | Tsang et al. |
| 5,447,884 A | 9/1995 | Fahey et al. |
| 5,504,034 A | 4/1996 | Rapisarda |
| 5,578,518 A | 11/1996 | Koike et al. |
| 5,770,504 A | 6/1998 | Brown et al. |
| 5,780,346 A | 7/1998 | Arghavani et al. |
| 5,858,857 A | 1/1999 | Ho |
| 5,863,827 A | 1/1999 | Joyner |
| 5,899,726 A | 5/1999 | Wang et al. |
| 5,910,018 A | 6/1999 | Jang |
| 5,911,110 A | 6/1999 | Yu |
| 5,920,787 A | 7/1999 | Haskell et al. |
| 5,930,644 A | 7/1999 | Tsai et al. |
| 5,943,590 A | 8/1999 | Wang et al. |
| 6,033,969 A | 3/2000 | Yoo et al. |
| 6,033,991 A | 3/2000 | Ramkumar et al. |
| 6,040,231 A | 3/2000 | Wu |
| 6,040,232 A | 3/2000 | Gau |
| 6,057,241 A | 5/2000 | Matsuda et al. |
| 6,090,684 A | 7/2000 | Ishitsuka et al. |
| 6,124,184 A | 9/2000 | Jeong |
| 6,242,323 B1 | 6/2001 | Ishitsuka et al. |
| 6,248,636 B1 | 6/2001 | Park |
| 6,265,286 B1 | 7/2001 | Boyer et al. |
| 6,326,282 B1 | 12/2001 | Park et al. |
| 6,365,490 B1 | 4/2002 | Mathews et al. |
| 6,468,849 B1 | 10/2002 | Efland et al. |
| 6,559,027 B2 | 5/2003 | Ishitsuka et al. |
| 2005/0153521 A1 * | 7/2005 | Kanamitsu et al. .......... 438/424 |

FOREIGN PATENT DOCUMENTS

| | | |
|---|---|---|
| EP | 0773582 | 5/1997 |
| GB | 2314682 | 1/1998 |
| JP | 02-260660 | 10/1990 |
| WO | WO 98/36452 | 8/1998 |

OTHER PUBLICATIONS

English translation of Official Action mailed Sep. 26, 2006, in JP 10-374,881.

* cited by examiner

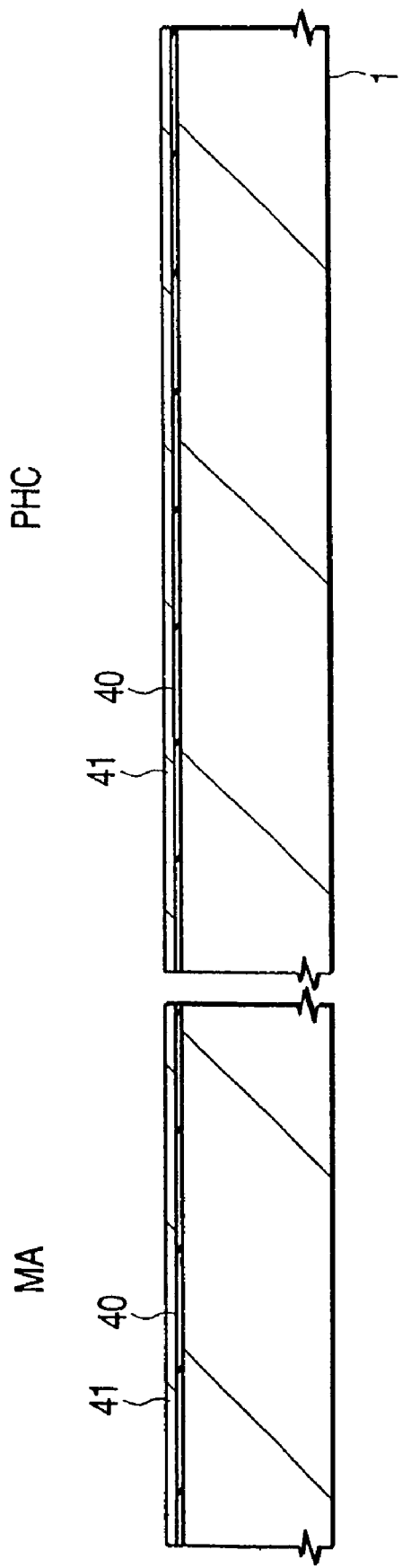

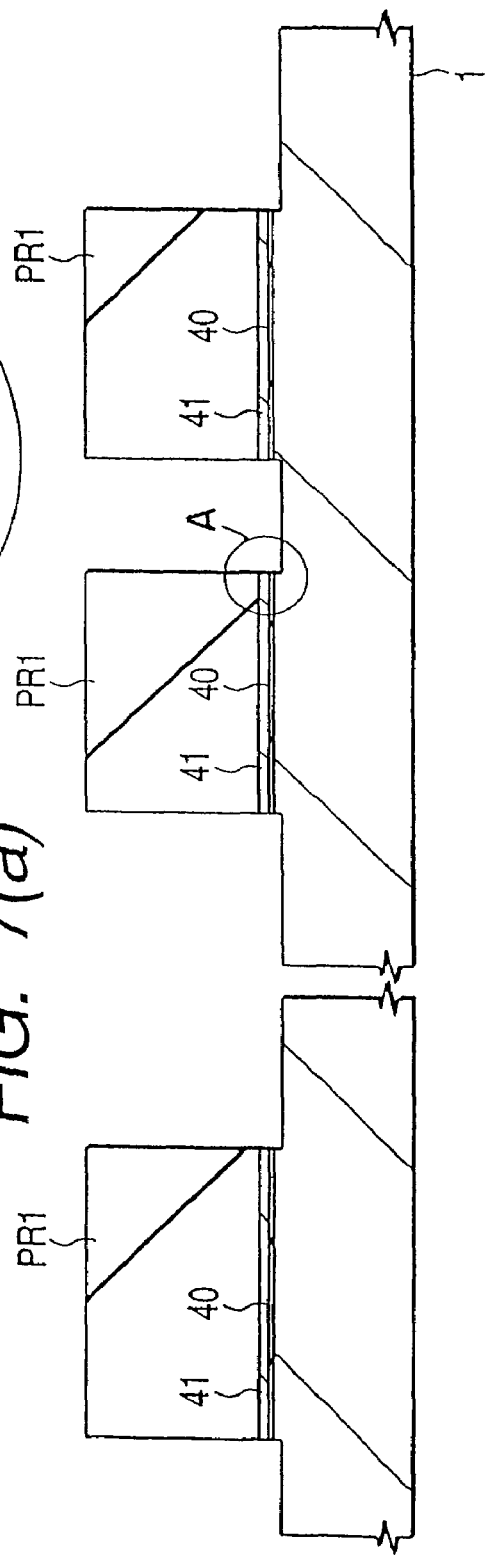
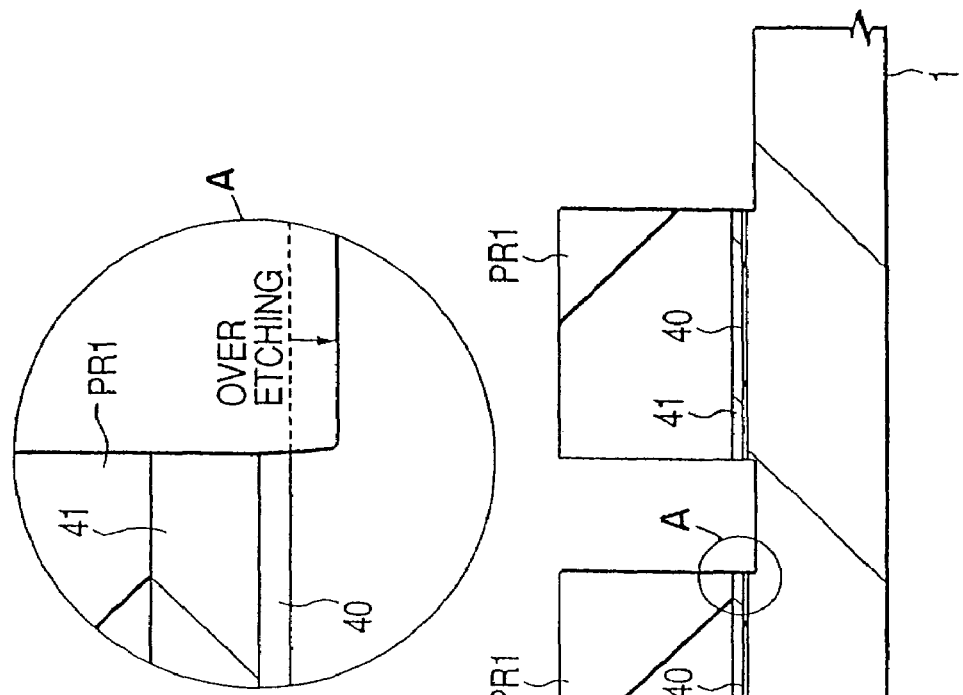
FIG. 7(b)
FIG. 7(a)

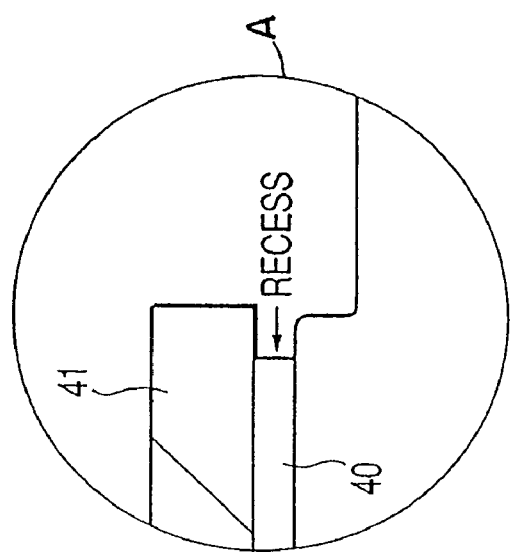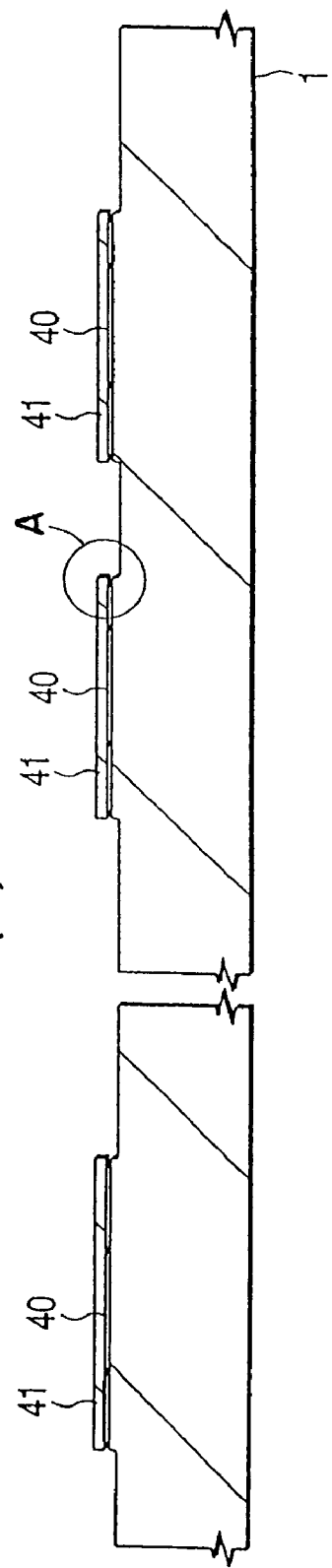

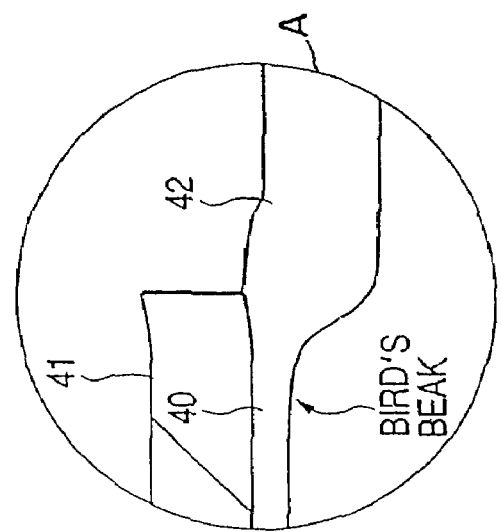
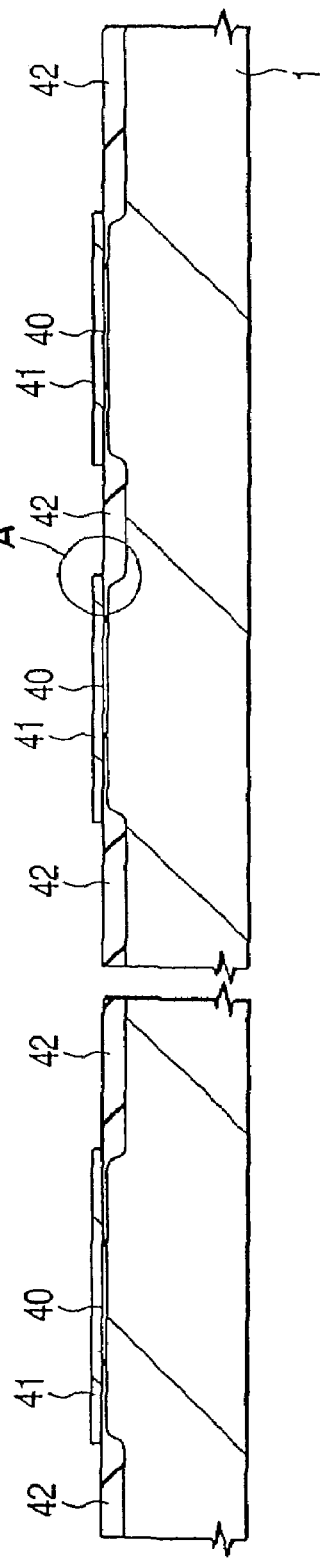
FIG. 9(a)
FIG. 9(b)

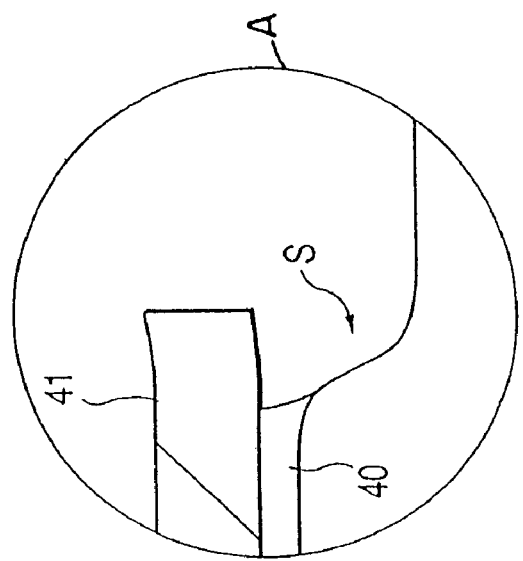
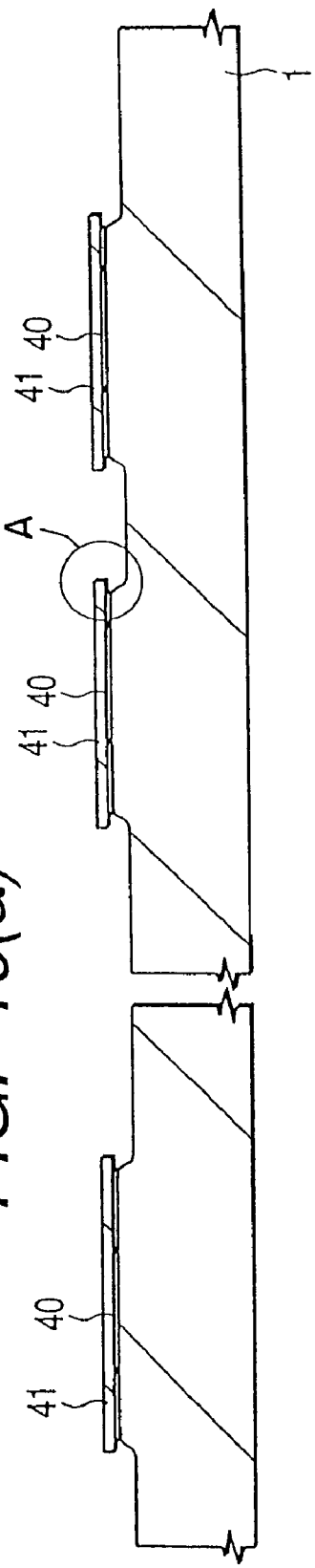
FIG. 10(b)
FIG. 10(a)

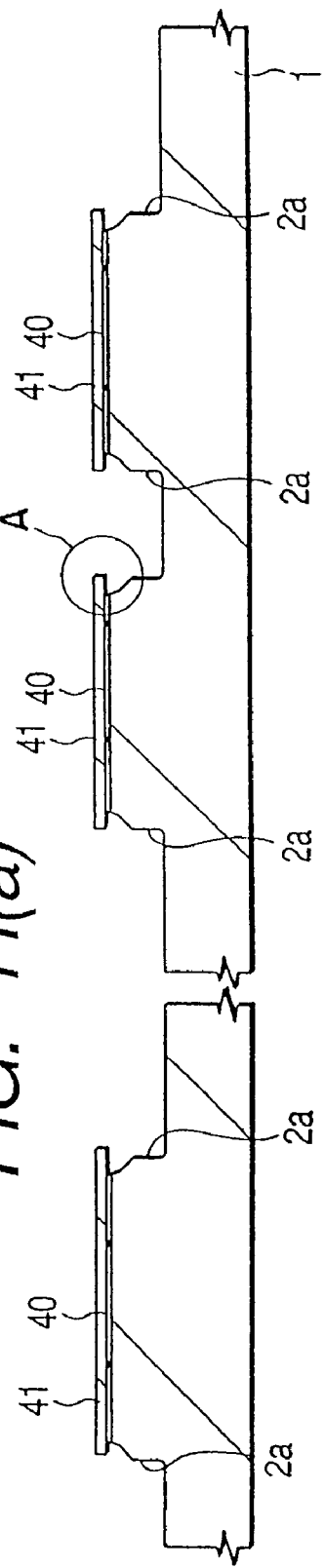
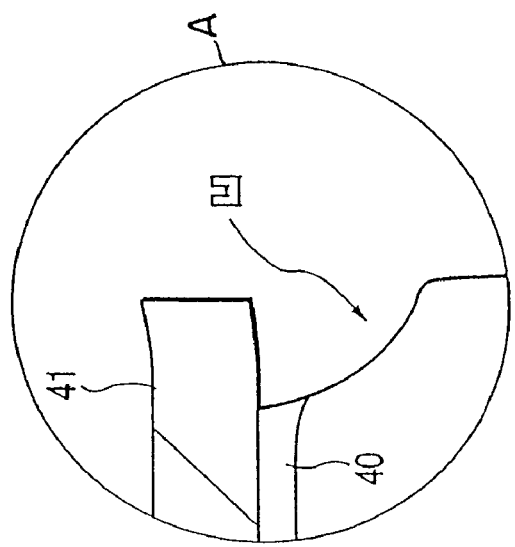
FIG. 11(b)
FIG. 11(a)

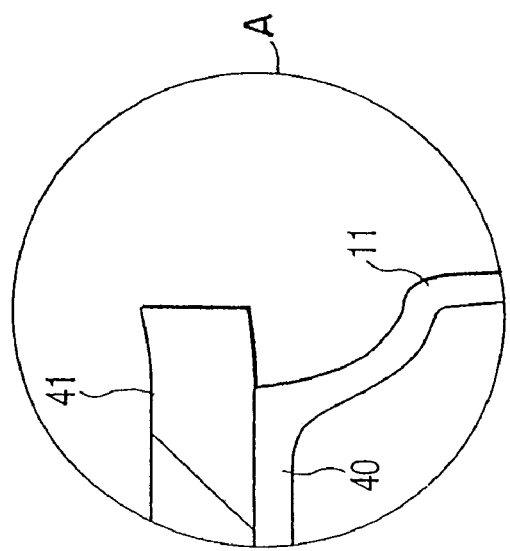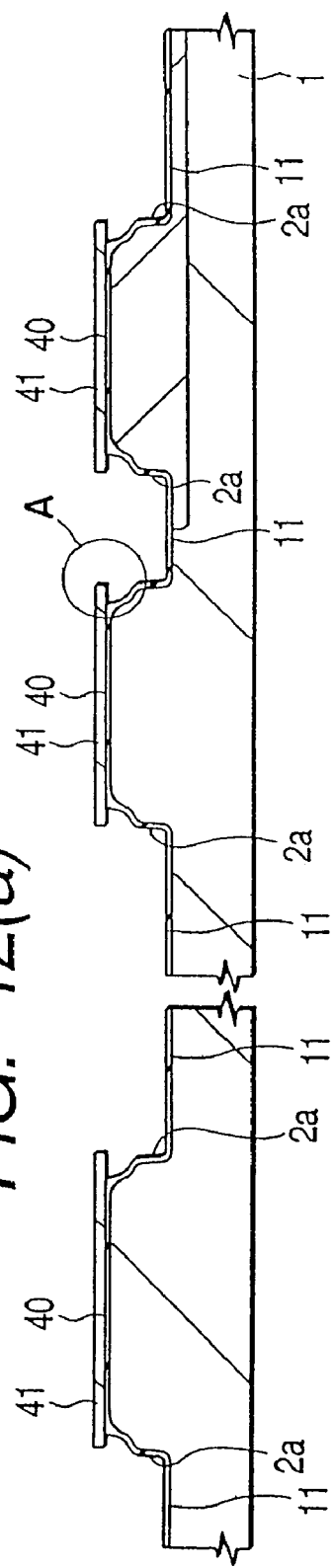

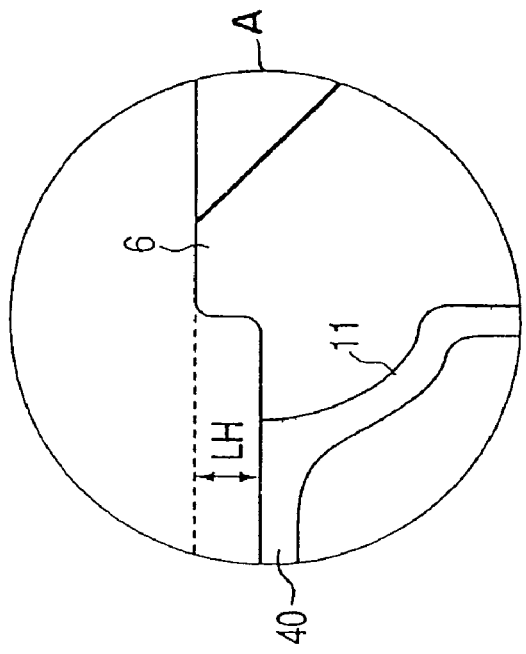
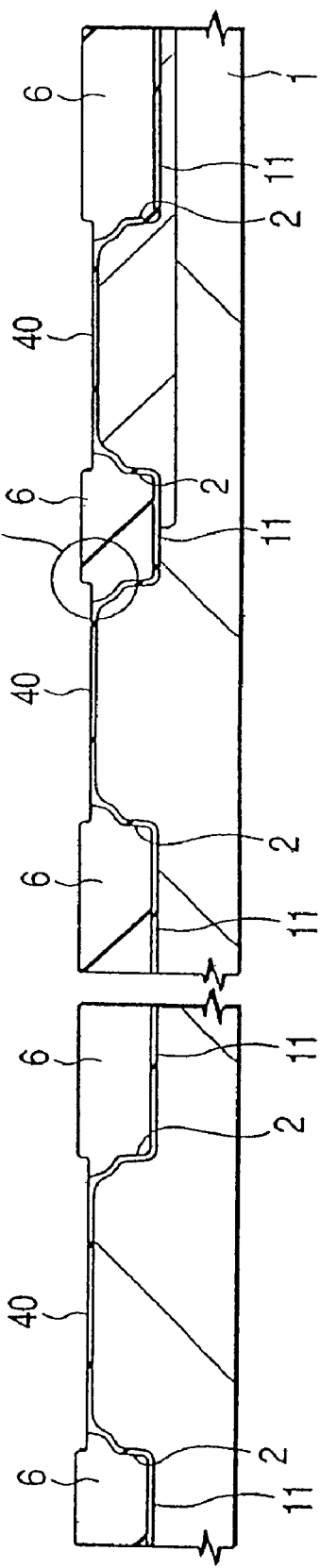
FIG. 16(b)
FIG. 16(a)

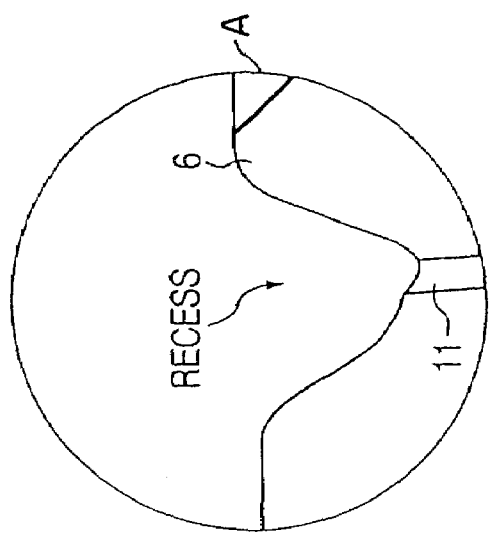
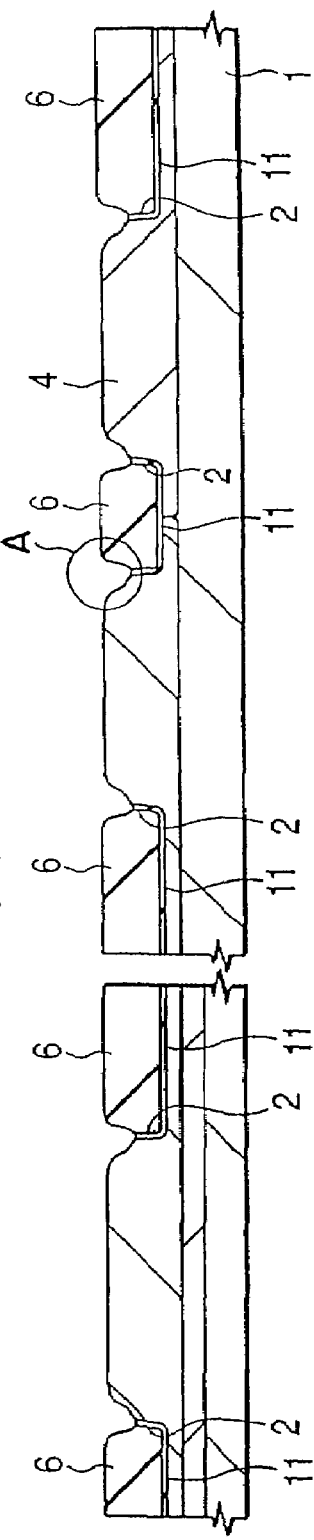
FIG. 17(b)
FIG. 17(a)

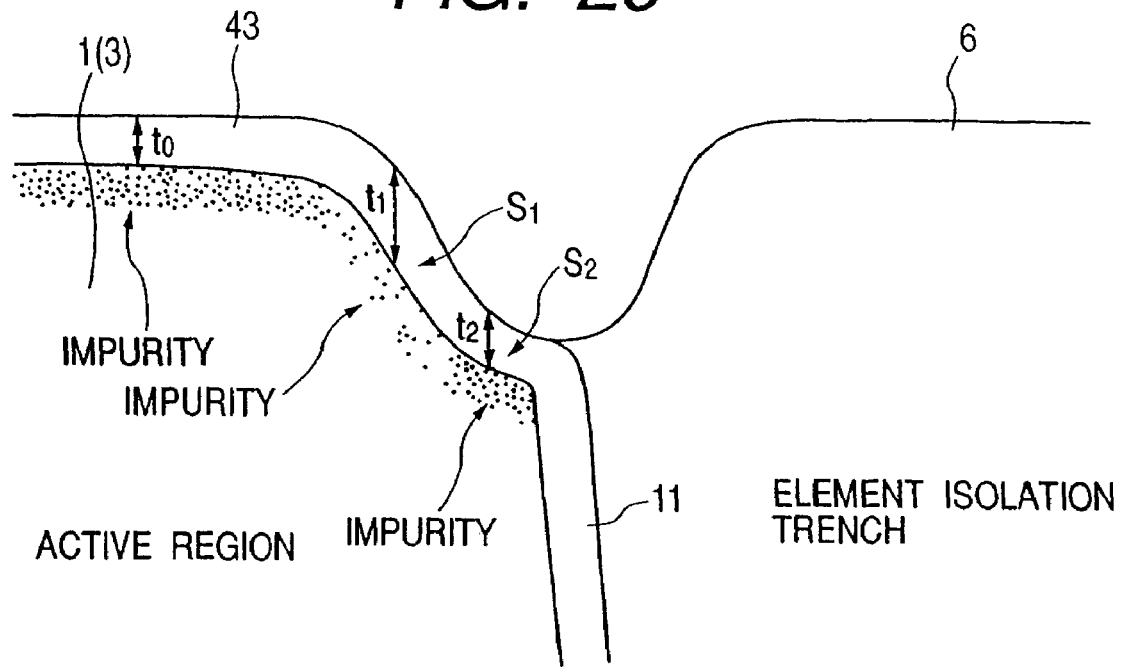
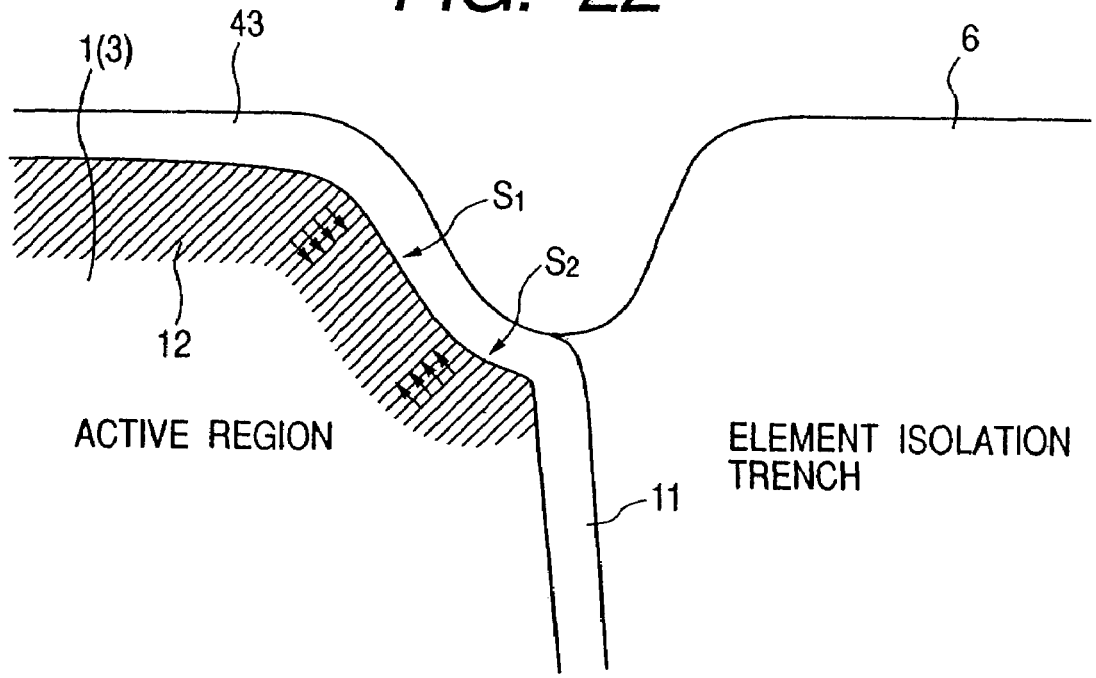

METHOD OF MANUFACTURING A SEMICONDUCTOR INTEGRATED CIRCUIT DEVICE HAVING A TRENCH

This application is a Continuation application of application Ser. No. 10/919,432, filed Aug. 17, 2004, now U.S. Pat. No. 6,967,141 which is a Divisional application of application Ser. No. 10/270,188, filed Oct. 15, 2002, now abandoned which is a Divisional application of application Ser. No. 09/473,297, filed Dec. 28, 1999, the contents of which are incorporated herein by reference in their entirety. Application Ser. No. 09/473,297 has now issued as U.S. Pat. No. 6,544,839, on Apr. 8, 2003.

FIELD OF THE INVENTION

The present invention relates to a semiconductor integrated circuit device and a method of manufacturing the same; and, more specifically, the invention relates to an effective technology adapted to an element isolation structure for forming a fine MISFET (Metal Insulator Semiconductor Field Effect Transistor) and a method of manufacturing the same.

BACKGROUND OF THE INVENTION

Although local oxidation of silicon (LOCOS) has been widely used as an element isolation technology in an LSI production process, the introduction of a new element isolation technology is being developed to facilitate the downsizing of a semiconductor element.

Shallow groove isolation (SGI) which is effected by burying an insulating film, such as a silicon oxide film, in a trench formed in a silicon substrate can (a) reduce the interval between, (b) easily control the thickness of an element isolating film and set a field reverse voltage, and (c) separate an anti-reflection layer from a diffusion layer and a channel region by striking different impurities into the side wall and the bottom of the trench. Therefore, it is more advantageous in securing sub-threshold characteristics and reducing a bonding leak and back-gate effect than the local oxidation of silicon.

A general method of forming an element isolation trench is as follows. A silicon substrate is first thermally oxidized to form a thin silicon oxide film on the surface, a silicon nitride film is formed on the silicon oxide film by chemical vapor deposition (CVD), and the silicon nitride film of an element isolation region is removed by dry etching using a photoresist film as a mask. Thereafter, the photoresist film is removed, a trench as deep as 350 to 400 nm is formed in the substrate by dry etching using the silicon nitride film as a mask, and the substrate is thermally oxidized to form a thin silicon oxide film on the inner wall of the trench. This silicon oxide film is formed to eliminate etching damage which occurs on the inner wall of the trench and to alleviate the stress of the silicon oxide film buried in the inside of the trench in a later step.

After a thick silicon oxide film is formed on the substrate containing the inside of the trench by CVD, the substrate is heated to finely densify the silicon oxide film buried in the inside of the trench. Thereafter, the silicon oxide film formed on the silicon nitride film is removed by chemical mechanical polishing (CMP) so that the silicon oxide film remains only in the inside of the trench, and the unnecessary silicon nitride film is removed by etching to complete an element isolation trench.

It is known that, in the above element isolation structure, a gate oxide film formed on the surface of the substrate of an active region is locally thin at the end portion (shoulder portion) of the active region and the field of gate voltage is concentrated upon this shoulder portion with the result of the occurrence of a phenomenon in which a drain current flows with a low gate voltage (may be called "kink characteristics" or "hump characteristics"). As a solution to this, a technology for rounding the shoulder portion of the active region is proposed.

For example, Japanese Patent Laid-open No. Sho 63-2371 indicates such a problem that, when a fine MISFET having a channel width of 1 μm or less is formed in the active region of the substrate surrounded by the above element isolation trench, it cannot be used as a device due to a reduction in threshold voltage (Vth), so-called "narrow channel effect". This is because the shoulder portion of the active region has an angular cross section close to a right angle in the element isolation structure where an insulating film is buried in the inside of a trench formed in the substrate, whereby the field of the gate voltage is concentrated upon this region and a channel is formed with a low gate voltage.

The above publication discloses a technology for preventing a reduction in threshold voltage by forming a trench in the substrate, rounding the shoulder portion of the active region through wet oxidization at 950° C. and thickening the gate oxide film of the shoulder portion of the active region in order to suppress the above narrow channel effect.

Japanese Patent Laid-open No. Hei 2-260660 also discloses a technology for suppressing the concentration of the field of the gate voltage upon the shoulder portion of the active region by rounding the shoulder portion to prevent the occurrence of the above kink (hump) characteristics. In this publication, the shoulder portion of the active region is substantially rounded by the following method.

The element formation region of a semiconductor substrate is covered with a mask made of a laminate film consisting of an oxide film and an oxidation resistant film, and the substrate is thermally oxidized in this state to form an oxide film on the substrate of an element isolation region such that one end of the oxide film encroaches on the element formation region. Thereafter, the oxide film of the element isolation region is removed by wet etching using the above oxidation resistant film as a mask, a trench is formed in the substrate of the element isolation region by reactive ion etching using the above oxidation resistant film as a mask, the substrate is thermally oxidized to form a thermal oxide film on the inner wall of the trench, and the shoulder portion of the trench is rounded.

SUMMARY OF THE INVENTION

FIG. 30 is an enlarged view of the shoulder portion of the active region and therearound. A left part of the figure shows the substrate of the active region on the surface of which a gate oxide film 60 is formed. A right part of the figure shows an element isolation trench in which a silicon oxide film 61 is buried. Further, a gate electrode 62 which extends in right and left directions of the figure is formed on the top of the active region and the element isolation trench.

As shown in the figure, in the element isolation trench formed by burying the silicon oxide film 61 in the inside of a trench formed in the substrate, the surface of the silicon oxide film 61 is recessed downward in the vicinity of the active region. When the trench is formed in the substrate by etching using a silicon nitride film formed on the substrate of the active region as a mask, the silicon oxide film 61 is buried in the inside of the trench to flatten the surface, and the unnecessary silicon nitride film is removed by etching, a level difference corresponding to the thickness of the silicon nitride film is produced between the surface of the substrate of the active region and the surface of the silicon oxide film 61 buried in the trench. When the surface of the silicon oxide film 61 is wet etched with hydrofluoric acid to reduce this level difference, portions in contact with the silicon nitride film, that is, the top surface and side surface of the silicon oxide film 61 in the vicinity of the active region are exposed to hydrofluoric acid, whereby the amount of etching in that region is larger than that of the silicon oxide film 61 of a region spaced from the active region.

When the silicon oxide film 61 in the vicinity of the active region is recessed downward as described above, an end portion of the gate oxide film 60 formed on the surface of the substrate of the shoulder portion of the active region reaches part of the side wall of the element isolation trench. However, as it is difficult to strike an impurity for forming a channel into the side wall of the element isolation trench, the concentration of an impurity in this region becomes lower than the concentration of an impurity in a flat portion of the active region. As a result, when voltage is applied to the gate electrode, a sub-channel is formed in the shoulder portion of the active region before a channel is formed in the flat portion of the active region, resulting in a reduction in threshold voltage. Particularly, when the gate width is reduced along with a reduction in the width of a MISFET, the influence of the sub-channel becomes marked and a reduction in threshold voltage becomes large. This phenomenon represents a very serious problem for a surface channel type MISFET in which a gate electrode is formed from n type polycrystal silicon.

As means of preventing the above reduction in threshold voltage, it is conceivable to increase the dose of an impurity for the formation of a channel so as to compensate for a reduction in the concentration of the impurity in the shoulder portion of the active region. However, since the concentration of the impurity in the substrate increases in this method, in the case of a dynamic random access memory (DRAM), for example, the field strength becomes high in the vicinity of the semiconductor region of a storage node and a leakage current grows, thereby causing a reduction in refresh characteristics and an increase in the parasitic capacity of a bit line.

When a fine MISFET is to be thus formed in the active region of the substrate surrounded by the element isolation trench, a reduction in threshold voltage cannot be prevented by rounding the shoulder portion of the active region and some measure must be taken to suppress the formation of a sub-channel in the shoulder portion of the active region as described above.

It is an object of the present invention to provide a technology for promoting a reduction in the size of a MISFET by optimizing the shape of an element isolation trench.

It is another object of the present invention to provide a technology for improving the refresh characteristics of a DRAM whose size has been reduced.

The above and other objects and new features of the present invention will become apparent from the following description and the accompanying drawings.

According to a first aspect of the invention, there is provided a semiconductor integrated circuit device having MISFETs, each formed on a substrate of an active region whose circumference is defined by an element isolation trench, wherein an inclined surface which falls toward the side wall of the element isolation trench is formed on the surface of the substrate at the periphery of the active region, and the inclined surface includes a first inclined surface located at the center of the active region and a second inclined surface which is interposed between the first inclined surface and the side wall of the element isolation trench and is more gently inclined than the first inclined surface.

According to another aspect of the present invention, there is provided a method of manufacturing a semiconductor integrated circuit device comprising the steps of:

(a) forming a first silicon oxide film on the surface of a substrate made from monocrystal silicon by thermally oxidizing the substrate and then forming an oxidation resistant film on the first silicon oxide film, and selectively exposing the surface of the substrate by etching the oxidation resistant film and the first silicon oxide film of an element isolation region;

(b) forming a second silicon oxide film having a thickness larger than that of the first silicon oxide film on the surface of the substrate which is exposed in the above step (a) by thermally oxidizing the substrate;

(c) exposing the surface of the substrate of the element isolation region by etching the second silicon oxide film;

(d) forming a trench in the substrate of the element isolation region by etching the substrate exposed in the above step (c) and forming a third silicon oxide film on the inner wall of the trench by thermally oxidizing the substrate;

(e) forming a fourth silicon oxide film on the oxidation resistant film containing the inside of the trench and then an element isolation trench having the fourth silicon oxide film buried therein in the substrate of the element isolation region by polishing the fourth silicon oxide film using the oxidation resistant film as a stopper;

(f) removing the oxidation resistant film and introducing an impurity into the substrate to control the threshold voltage of a MISFET; and (g) exposing the surface of the substrate by etching, and forming a gate insulating film on the surface of the substrate and further a gate electrode for the MISFET on the gate insulating film.

BRIEF DESCRIPTION OF THE ACCOMPANYING DRAWINGS

FIG. 6 is a sectional view of key parts of a substrate showing a method of manufacturing a semiconductor integrated circuit device according to an embodiment of the present invention;

FIG. 7(*a*) is a sectional view of the key parts of the substrate showing the method of manufacturing a semiconductor integrated circuit device according to the embodiment of the present invention, and FIG. 7(*b*) is an enlarged view of the area A in FIG. 7(*a*);

FIG. 8(*a*) is a sectional view of the key parts of the substrate showing the method of manufacturing a semiconductor integrated circuit device according to the embodiment of the present invention, and FIG. 8(b) is an enlarged view of the area A in FIG. 8(a);

FIG. 9(a) is a sectional view of the key parts of the substrate showing the method of manufacturing a semiconductor integrated circuit device according to the embodiment of the present invention, and FIG. 9(b) is an enlarged view of the area A in FIG. 9(a);

FIG. 10(a) is a sectional view of the key parts of the substrate showing the method of manufacturing a semiconductor integrated circuit device according to the embodiment of the present invention, and Fib 10(b) is an enlarged view of the are A in FIG. 10(a);

FIG. 11(a) is a sectional view of the key parts of the substrate showing the method of manufacturing a semiconductor integrated circuit device according to the embodiment of the present invention, and FIG. 11(b) is an enlarged view of the area A in FIG. 11(a);

FIG. 12(a) is a sectional view of the key parts of the substrate showing the method of manufacturing a semiconductor integrated circuit device according to the embodiment of the present invention, and FIG. 12(b) is an enlarged view of the area A in FIG. 12(b);

FIG. 16(a) is a sectional view of the key parts of the substrate showing the method of manufacturing a semiconductor integrated circuit device according to the embodiment of the present invention, and FIG. 16(b) is an enlarged view of the area A in FIG. 16(a);

FIG. 17(a) is a sectional view of the key parts of the substrate showing the method of manufacturing a semiconductor integrated circuit device according to the embodiment of the present invention, and FIG. 17(b) is an enlarged view of the area A in FIG. 17(a);

FIG. 20 is an enlarged view of the shoulder portion of the active region and therearound;

FIG. 22 is an enlarged view of the shoulder portion of the active region and therearound;

DETAILED DESCRIPTION OF THE PREFERRED EMBODIMENTS

Preferred embodiments of the present invention will be described hereinunder with reference to the accompanying drawings. Elements having the same functions are given the same reference symbols in all the figures for explaining the preferred embodiments of the present invention and their descriptions are not repeated.

Figure 1:
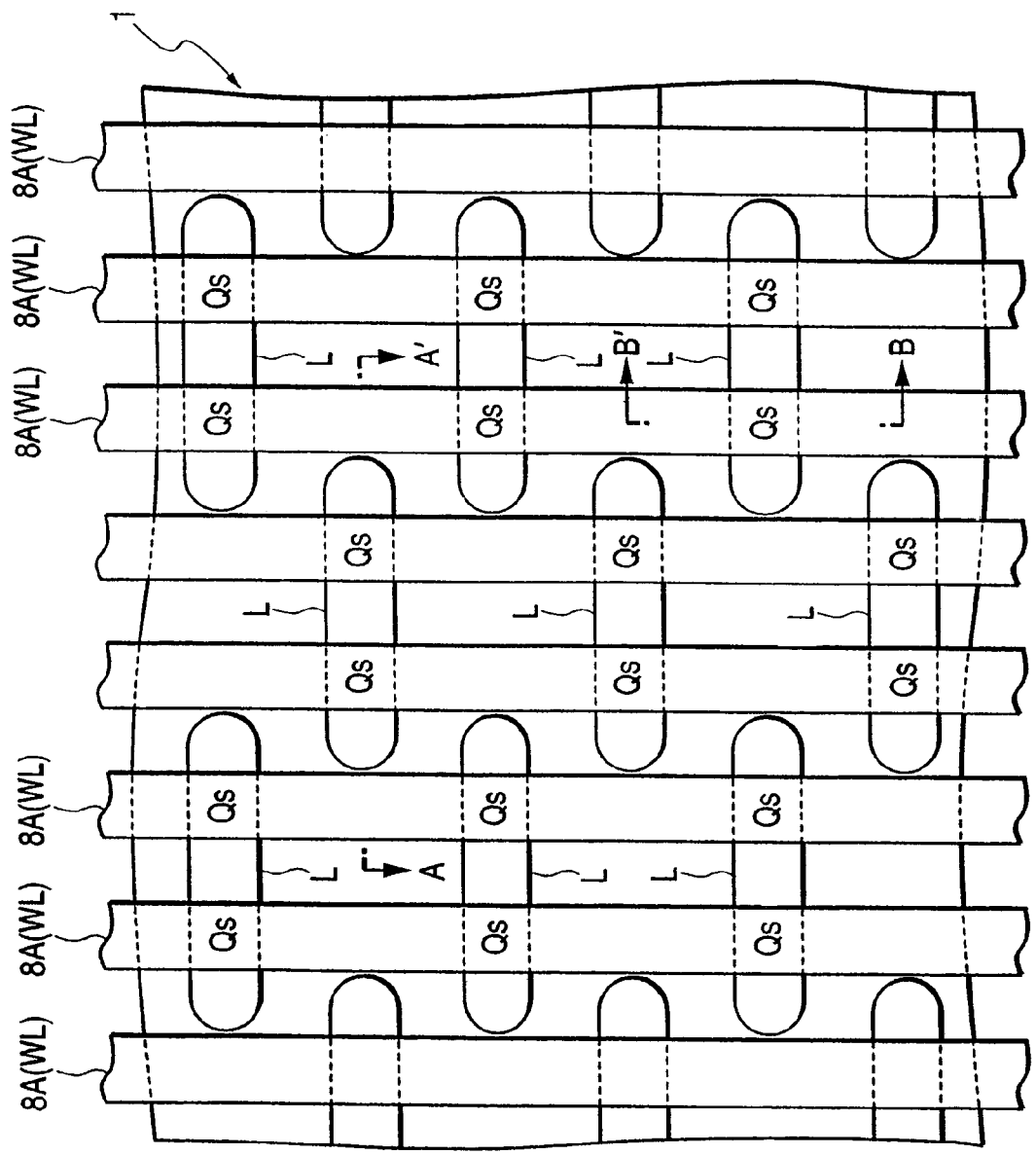
FIG. 1 is a plan view of key parts of a substrate during the production process of a semiconductor integrated circuit device according to an embodiment of the present invention.
Figure 2:
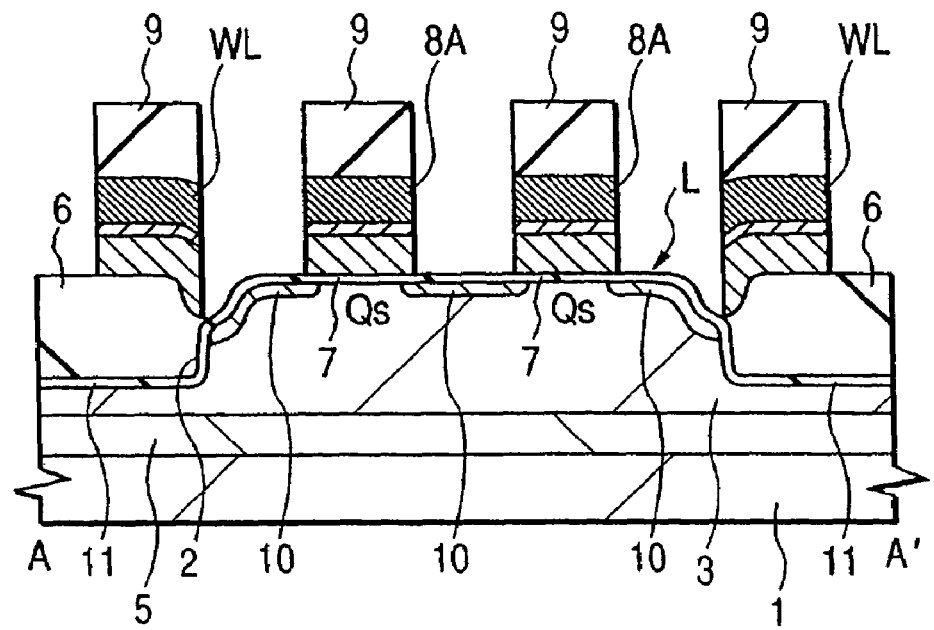
FIG. 2 is a sectional view of the substrate cut on line A-A' of FIG. 1.
Figure 3:
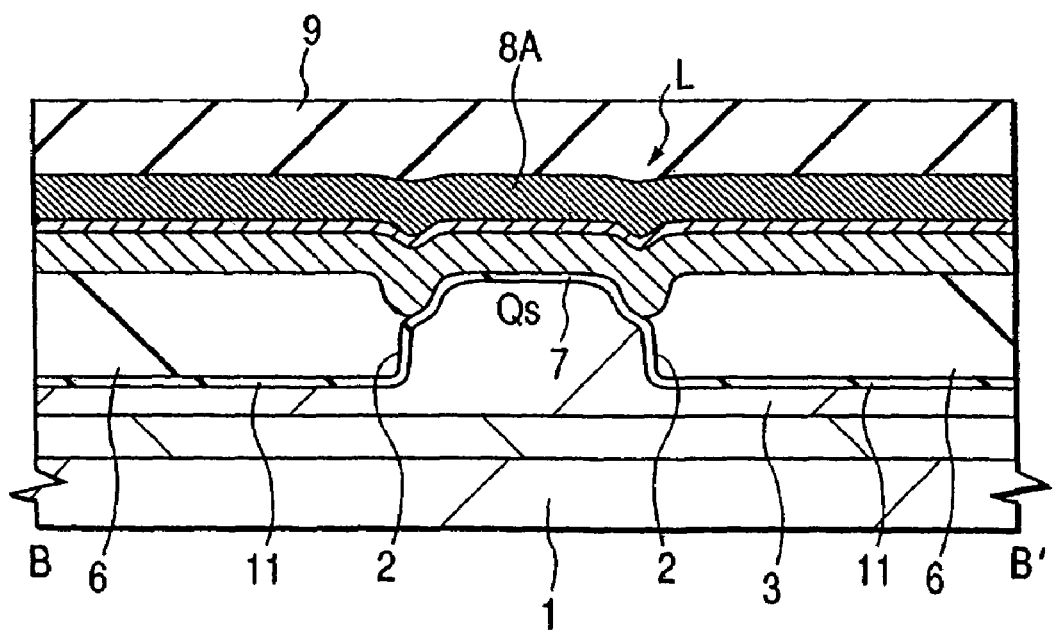
FIG. 3 is a sectional view of the substrate cut on line B-B' of FIG. 1.

FIG. 1 is a plan view of the key parts of a substrate in the process of production. FIG. 2 is a sectional view of the substrate cut on line A-A' of FIG. 1 and FIG. 3 is a sectional view of the substrate cut on line B-B' of FIG. 1.

Active regions L whose circumferences are defined by element isolation trenches 2 are formed in p type wells 3 formed on the main surface of a substrate 1 made from p type monocrystal silicon. Each of the active regions L has a long island-like pattern and its plane size is 0.6 μm in a longitudinal direction and 0.12 μm in a transverse direction. Two MISFETQs for the selection of a memory cell which share one of a source and a drain are formed in each of the active regions L. The MISFETQs for the selection of a memory cell constitute part of the memory cells of a DRAM and are connected in series to information storage capacitor elements C formed on the top of the MISFETQs in a later step.

The above MISFETQs for the selection of a memory cell are each mainly composed of a gate oxide film 7, a gate electrode 8A and a pair of n type semiconductor regions 10 (source and drain). The gate electrodes 8A of the MISFETQs for the selection of a memory cell are integrated with word lines WL and extend linearly with the same line width and the same interval as those of the word lines WL in a vertical direction (second direction) of FIG. 1. The line width (gate length) and interval of the gate electrodes 8A (word lines WL) in a horizontal direction (first direction (X)) of FIG. 1 are a minimum (for example, 0.12 μm) determined by the resolution limit of photolithography. The gate electrodes 8A have such a polymetal structure that a barrier metal film such as a WN (tungsten nitride) film and a W (tungsten) film are formed on the top of a low resistance polycrystal silicon film doped with an n type impurity such as P (phosphorus). On the top of the gate electrodes 8A (word lines WL), a silicon nitride film 9 having the same plane pattern as the gate electrodes 8A (word lines WL) is formed.

Figure 4A:
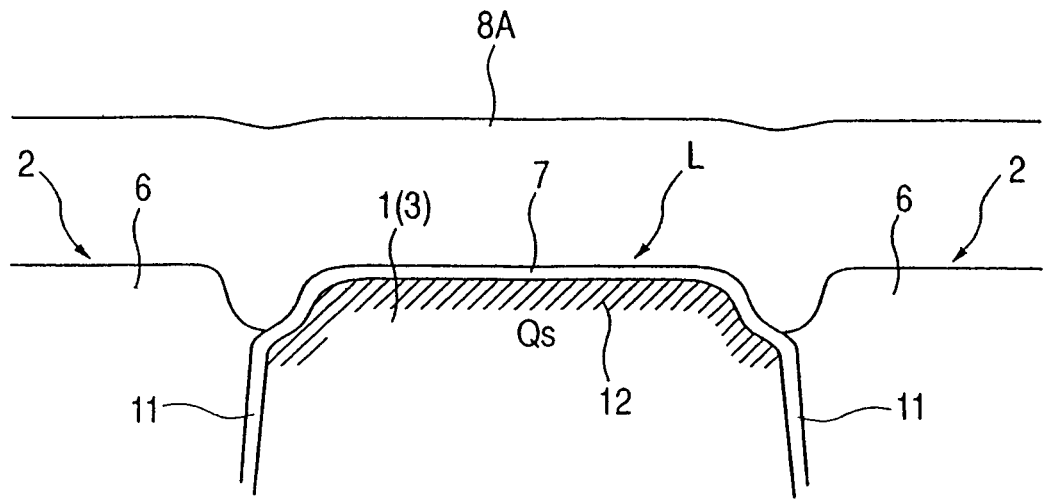
FIG. 4(*a*) is an enlarged view of an element isolation trench in an active region and thereabround, and FIG. 4(*b*) is an enlarged view of a shoulder portion of the active region and thereabround.
Figure 4B:
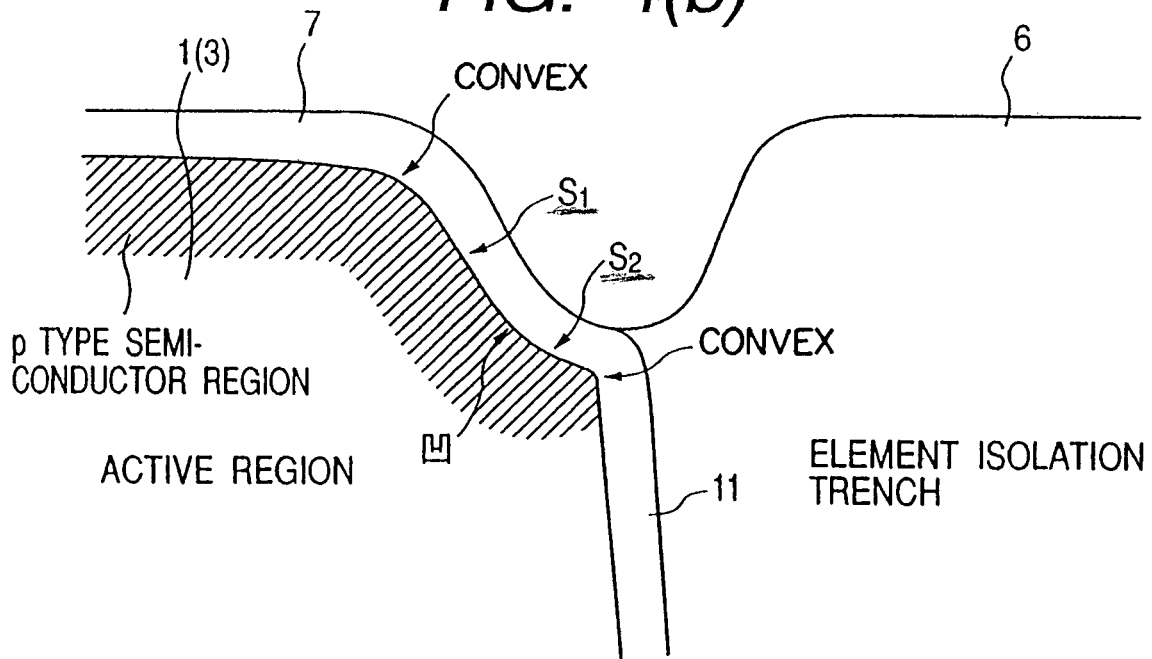
Figure 5:
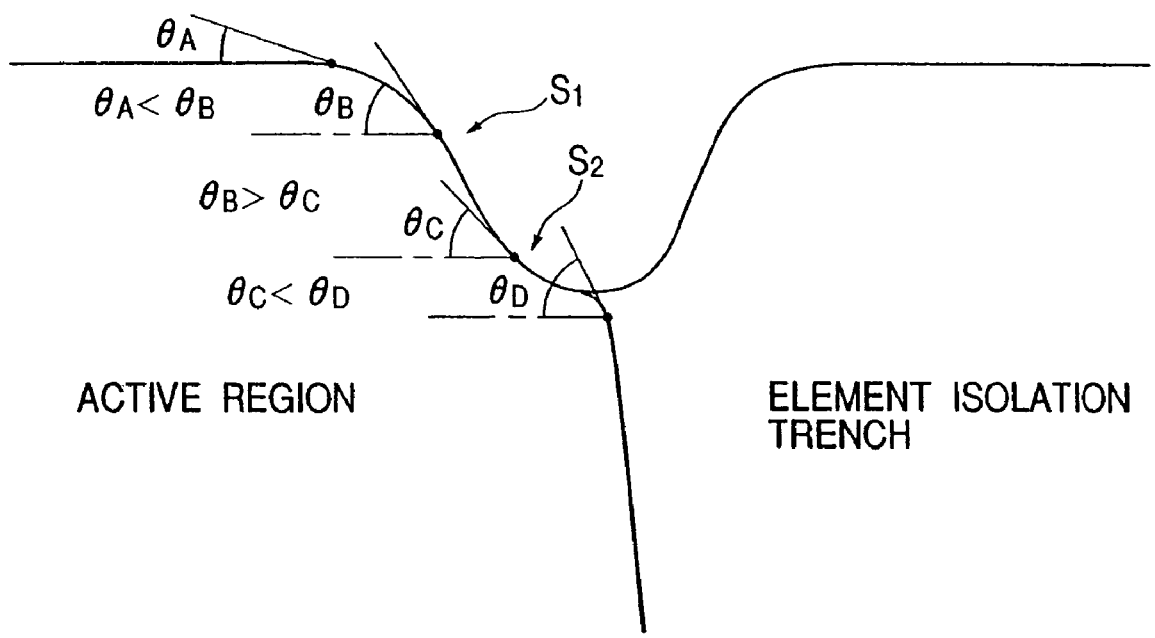
FIG. 5 is an enlarged view of the shoulder portion of the active region and thereabround.

FIG. 4(a) is an enlarged view of the active region L and an element isolation trench 2 in the vicinity of the active region L in a vertical direction (second direction (Y)) of FIG. 1 and FIG. 4(b) and FIG. 5 are enlarged views of a shoulder portion of the active region L and therearound in a vertical direction (second direction) of FIG. 1.

The element isolation trench 2 surrounding the active region L is such a structure that a silicon oxide film 6 is buried inside the trench formed in the substrate 1 (p type well 2). A thin silicon oxide film 11 for alleviating stress generated between the silicon oxide film 6 and the substrate 1 is formed at the interface between the inner wall of the element isolation trench 2 and the silicon oxide film 6. The surface (top surface) of the above silicon oxide film 6 buried in the element isolation trench 2 is almost flush with the surface (gate oxide film 7) of the substrate 1 of the active region L, but is recessed downward (to the substrate 1 side) in the vicinity of the active region L.

The surface of the substrate 1 of the active region L surrounded by the above element isolation trench 2 is a horizontally flat surface in the center portion of the active region L, but is an inclined surface which falls toward the side wall of the element isolation trench 2 in the shoulder portion of the active region L. As shown in FIG. 4(b), this inclined surface includes two inclined surfaces ($S_1$, $S_2$) having different inclination angles. The first inclined surface ($S_1$) near the center portion of the active region L is relatively steep and the second inclined surface ($S_2$) near the side wall of the element isolation trench 2 is more gentle than the first inclined surface ($S_1$).

The surface of the substrate 1 in the shoulder portion of the above active region L is wholly rounded and has no angular portion. Since the above two inclined surfaces ($S_1$, $S_2$) having different inclination angles are formed in the shoulder portion of the active region L, a boundary portion between the almost horizontally flat surface of the active region L and the first inclined surface ($S_1$) and a boundary portion between the side wall of the element isolation trench 2 and the second inclined surface ($S_2$) are rounded to form a convex surface. A boundary portion between the first sharply inclined surface ($S_1$) and the second gently inclined surface ($S_2$) is rounded to form a concave surface. That is, as shown in FIG. 5, an angle ($\theta$) between the tangent line of the shoulder portion of the active region L and the flat surface of the active region L gradually increases from the active region L side (left side of the figure) toward the element isolation trench 2 side (right side of the figure) ($\theta A<\theta B$), gradually decreases ($\theta B>\theta C$) and then increases again before the side wall of the element isolation trench 2 ($\theta C<\theta D$).

The gate oxide film 7 of the MISFETQs for the selection of a memory cell is formed on the surface of the substrate 1 of the active region L and the gate electrode 8A is formed on the gate oxide film 7. Since the surface of the silicon oxide film 6 buried in the element isolation trench 2 is recessed downward in the vicinity of the active region L and does not cover the shoulder portion of the active region L as described above, the gate oxide film 7 is formed on the shoulder portion of the active region L and its end portion extends to the lower end of the second inclined surface ($S_2$). Since the surface of the substrate 1 in the shoulder portion of the active region L is wholly rounded and has no angular portion, the thickness of the gate oxide film 7 in the shoulder portion of the active region L is almost equal to that of the gate oxide film 7 in the center portion of the active region L.

A p type semiconductor region 12 constituting a channel which forms the passage for a current flowing between the source and the drain when a predetermined voltage is applied to the gate electrode 8A is formed in the vicinity of the surface of the substrate 1 (p type well 3) underlying the gate oxide film 7. This p type semiconductor region 12 is doped with a p type impurity (boron) to adjust the threshold voltage (Vth) of the MISFETQs for the selection of a memory cell. That is, the MISFETQs for the selection of a memory cell are of a surface channel type. The end portion of the p type semiconductor region 12 formed in the vicinity of the surface of the substrate 1 (p type well 3) extends to the lower end of the second inclined surface ($S_2$) formed in the shoulder portion of the active region L and is located below the lower end of the gate electrode 8A on the second inclined surface ($S_2$). As will be described hereinafter, the concentration of the impurity (boron) introduced into this p type semiconductor region 12 is almost equal to that in the center portion of the active region L and the shoulder portion of the active region L.

A description is subsequently given of a method of manufacturing the above DRAM with reference to FIGS. 6 to 29. The left sides of FIGS. 6 to 19, FIG. 21 and FIGS. 23 to 29 show part of the memory array (MA) of the DRAM, and the right sides show part of the peripheral circuit (PHC) of the DRAM.

As shown in FIG. 6, a substrate 1 made from p type monocrystal silicon having a resistivity of 1 to 10 Ωcm, for example, is thermally oxidized at about 850° C. to form a thin silicon oxide film 40 (first silicon oxide film) having a thickness of about 10 nm on the surface, and then a silicon nitride film (oxidation resistant film) 41 having a thickness of about 120 nm is formed on the silicon oxide film 40 by CVD. The silicon nitride film 41 is used as a mask for forming a trench by etching the substrate 1 of the element isolation region. Since the silicon nitride film 41 is hardly oxidized, it is also used as a mask for preventing the oxidation of the surface of the substrate 1 therebelow. The silicon oxide film 40 underlying the silicon nitride film 41 is formed to alleviate stress generated at the interface between the substrate 1 and the silicon nitride film 41 and to prevent the occurrence of a defect such as dislocation on the surface of the substrate 1 caused by this stress.

As shown in FIG. 7(a), the surface of the substrate 1 is then exposed by selectively removing the silicon nitride film 41 of the element isolation region and the silicon oxide film 40 underlying the silicon nitride film 41 by dry etching using a photoresist film PR1 as a mask. At this point, as seen in FIG. 8(b), the substrate 1 is over-etched to completely remove the silicon oxide film 40 because, if a slight amount of the silicon oxide film 40 remains on the surface of the exposed substrate 1, it causes the formation of foreign matter. By recessing the substrate 1 of the element isolation region by over-etching, an inclined surface can be easily formed on the shoulder portion of the active region L formed in a later step. The amount of the substrate 1 over-etched may be about 10 to 30 nm.

After the photoresist film PR1 is removed by ashing, the surface of the substrate 1 is washed with a known SC-1 solution (mixed solution of ammonia water and hydrogen peroxide water) and SC-2 solution (mixed solution of hydrochloric acid and hydrogen peroxide water) to remove foreign matter remaining on the surface of the substrate 1 and further washed with hydrofluoric acid to remove an oxide film naturally formed on the surface of the substrate 1. When this washing is carried out, the oxide film is etched shallow isotropically, whereby the silicon oxide film 40 exposed from the end portion of the silicon nitride film 41 is etched shallow and the end portion thereof is recessed inward (to the active region L side) from the end portion of the silicon nitride film 41 as shown in FIG. 8(b). Thereby, an inclined surface is easily formed on the shoulder portion of the active region L formed in a later step. When the amount of this recess is large, the contact area between the silicon nitride film 41 and the silicon oxide film 40 decreases and the films are easily separated from each other at the interface between them. The amount of the silicon oxide film 40 recessed is preferably not more than an amount equivalent to the thickness thereof (for example, about 10 nm).

As shown in FIG. 9(a), a silicon oxide film (second silicon oxide film) 42 having a thickness (for example, about 20 to 65 nm) larger than that of the silicon oxide film 40 is formed on the surface of the substrate 1 of the element isolation region by thermally oxidizing the substrate 1 at about 800 to 1,000° C. The bird's beak of the silicon oxide film 42 extends inward (to the active region L side) from the end portion of the silicon nitride film 41 by this thermal oxidation, as seen in FIG. 9(b).

As shown in FIG. 10(a), the silicon oxide film 42 formed on the surface of the substrate 1 is then removed by wet etching using hydrofluoric acid to expose the surface of the substrate of the element isolation region again. The surface of the substrate 1 of the shoulder portion of the active region L which will be formed in a later step is inclined by the steps up to this point, as seen in FIG. 10(b). The above silicon oxide film 42 may be removed by dry etching or a combination of dry etching and wet etching.

As shown in FIG. 11(a), a trench 2a having a depth of about 350 to 400 nm is then formed in the substrate 1 of the element isolation region by dry etching using the silicon nitride film 41 as a mask. Since the shoulder portion of the active region L is also etched at this point, a concave surface is formed by the recessing of an intermediate portion of the inclined surface, as seen in FIG. 11(b). When this trench 2a is to be formed, the side wall of the trench 2a is tapered at an angle of 80° by controlling the composition of gas (for example, $CF_4+O_2$) for etching the substrate 1. A silicon oxide film (6) formed in a later step is easily buried in the inside of the trench 2a by tapering the side wall of the trench 2a.

After the residual etching solution which has adhered to the inner wall of the trench 2a is removed by washing with the above SC-1 solution, SC-2 solution and diluted hydrofluoric acid, as shown in FIG. 12(a), the substrate 1 is thermally oxidized at about 800 to 1,000° C. to form a thin silicon oxide film (third silicon oxide film) 11 having a thickness of about 10 nm on the inner wall of the trench 2a, as seen in FIG. 11(b). This silicon oxide film 11 is formed to recover from the damage of the inner wall of the trench 2a caused by dry etching and alleviate stress generated at the interface between the silicon oxide film 6 which will be buried in the inside of the trench 2a in a later step and the substrate 1. The surface of the substrate 1 of the shoulder portion of the active region L is rounded by this thermal oxidation to have a shape similar to those shown in FIG. 4(a) and FIG. 4(b).

Figure 13:
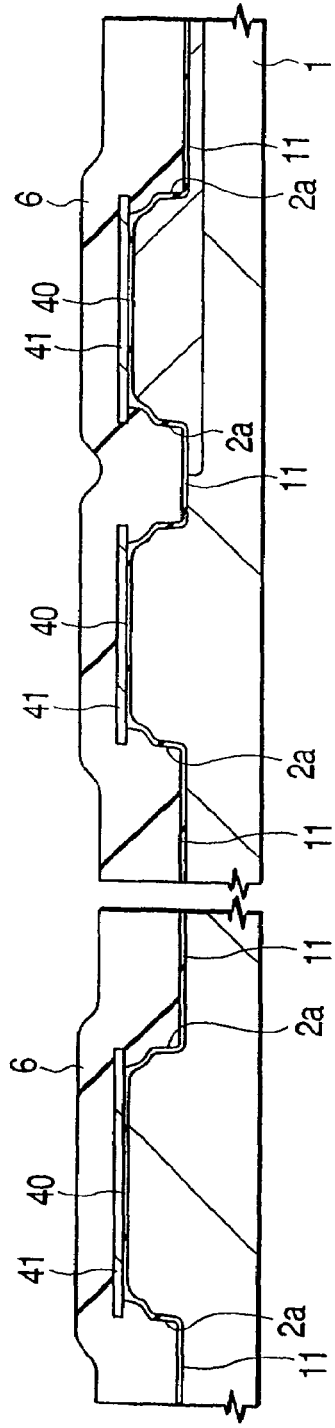
FIG. 13 is a sectional view of the key parts of the substrate showing the method of manufacturing a semiconductor integrated circuit device according to the embodiment of the present invention.

As shown in FIG. 13, a silicon oxide film (fourth silicon oxide film) 6 is formed on the substrate 1 containing the inside of the trench 2a by CVD. This silicon oxide film 6 has a thickness (for example, about 450 to 500 nm) larger than the depth of the trench 2a so that the inside of the trench 2a is completely covered with the silicon oxide film 6. The silicon oxide film 6 is formed by a film forming method having excellent step coverage like a silicon oxide film formed using oxygen and tetraethoxysilane $((C_2H_5)_4S_1)$. Prior to the step of forming this silicon oxide film 6, a thin silicon nitride film (unshown) may be formed on the inner wall of the trench 2a by CVD. This silicon nitride film has the function of preventing the thin silicon oxide film 11 formed on the inner side of the trench 2a from growing thick on the active region side when the silicon oxide film 6 buried in the trench 2a is to be densified.

Figure 14:
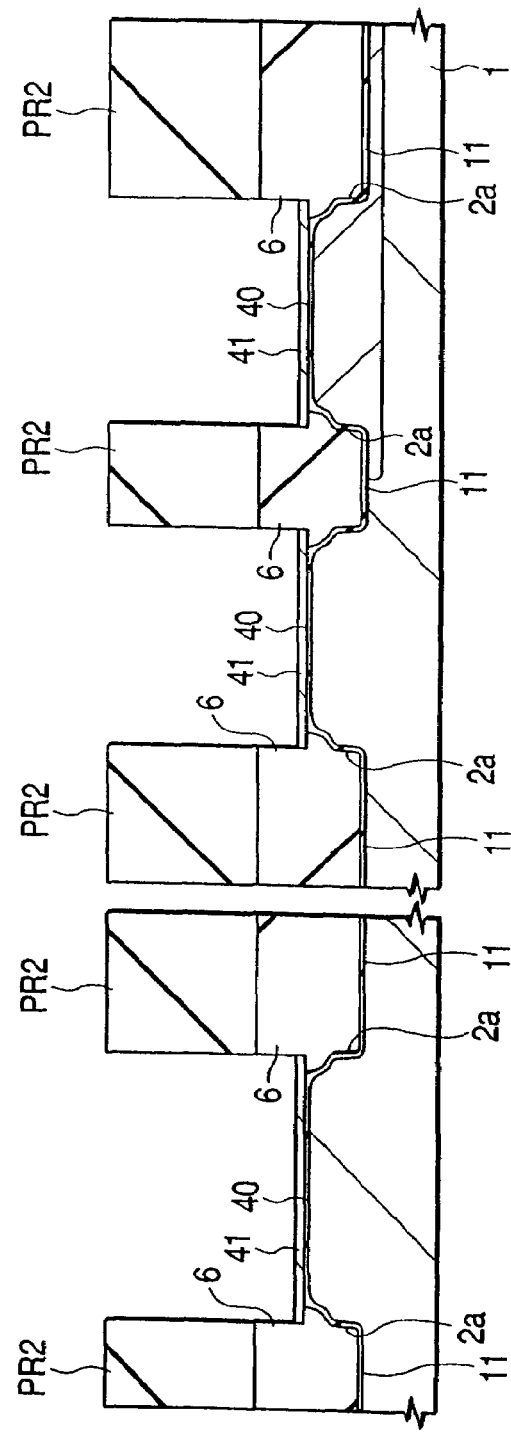
FIG. 14 is a sectional view of the key parts of the substrate showing the method of manufacturing a semiconductor integrated circuit device according to the embodiment of the present invention.

After the substrate 1 is thermally oxidized at about 1,000° C. and the silicon oxide film 6 buried in the trench 2a is densified to improve the quality of the film, as shown in FIG. 14, the silicon oxide film 6 overlying the silicon nitride film 41 is removed by dry etching using a photoresist film PR2 as a mask. The pattern of the photoresist film PR2 is the inversion pattern of the photoresist film PR1 used to dry etch the silicon nitride film 41 in the element isolation region.

Figure 15:
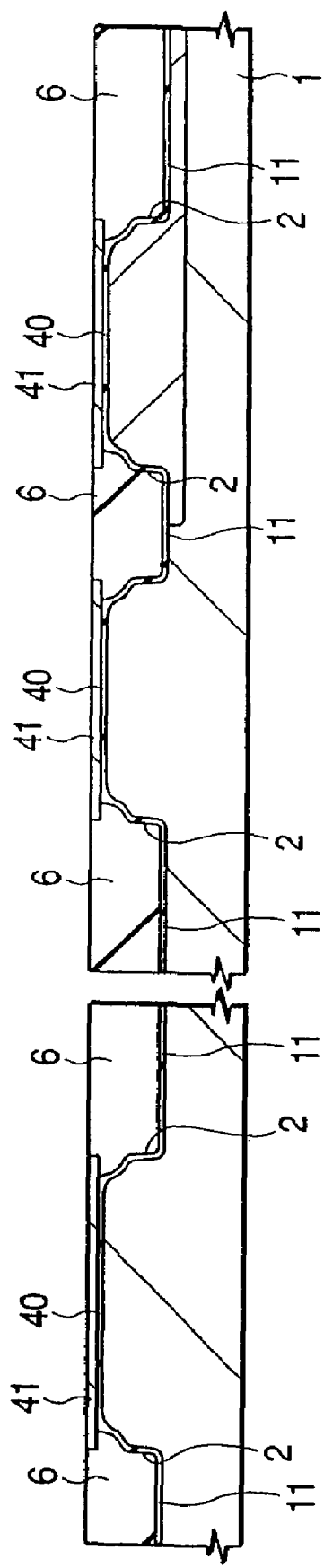
FIG. 15 is a sectional view of the key parts of the substrate showing the method of manufacturing a semiconductor integrated circuit device according to the embodiment of the present invention.

After the photoresist film PR2 is removed, as shown in FIG. 15, the silicon oxide film 6 formed on the trench 2a is polished by chemical mechanical polishing (CMP) to flatten the surface of the silicon oxide film 6. This polishing is carried out using the silicon nitride film 41 covering the surface of the substrate 1 of the active region L as a stopper and is terminated when the surface of the silicon oxide film 6 becomes flush with the surface of the silicon nitride film 41.

The polishing of the silicon oxide film 6 can be carried out without using the photoresist film PR2. That is, the silicon oxide film 6 may be polished by chemical mechanical polishing using the silicon nitride film 41 as a stopper after the silicon oxide film 6 is formed on the substrate 1 containing the inside of the trench 2a and then the silicon oxide film 6 is densified by thermally oxidizing the substrate 1. The densification of the silicon oxide film 6 may be carried out after the silicon oxide film 6 is polished by chemical mechanical polishing such that it remains only in the inside of the trench 2a. In this case, the silicon oxide film 6 is densified when the thickness of the silicon oxide film 6 becomes small, thereby making it possible to shorten the densifying time compared with the case where densification is carried out before polishing. The element isolation trench 2 in which the silicon oxide film 6 is buried is substantially completed by the steps up to this point.

Thereafter, the silicon nitride film 41 covering the surface of the substrate 1 of the active region L is removed with hot phosphoric acid to expose the underlying silicon oxide film 40. When the silicon nitride film 41 is removed, as shown in FIG. 16(a), a level difference (LH) equal to the thickness of the silicon nitride film 41 is produced between the surface of the silicon oxide film 40 formed on the surface of the substrate 1 of the active region L and the surface of the silicon oxide film 6 buried in the element isolation trench 2, as seen in FIG. 16(b).

As shown in FIG. 17(a), the surface of the silicon oxide film 6 buried in the element isolation trench 2 is wet etched with hydrofluoric acid to reduce the level difference between the surface of the silicon oxide film 6 and the surface of the substrate 1 of the active region L. The thin silicon oxide film 40 formed on the substrate 1 of the active region L is also etched at this point and the surface of the substrate 1 is exposed. Since the top surface and the side surface of a portion in contact with the silicon nitride film 41 of the silicon oxide film 6 are exposed to hydrofluoric acid, the amount of the silicon oxide film 6 etched is larger than that of the silicon oxide film 6 in a region spaced from the active region L. Thereby, the surface of the silicon oxide film 6 in the vicinity of the shoulder portion of the active region L is recessed inward and the surface of the substrate 1 of the shoulder portion of the active region L is exposed, as seen in FIG. 17(b).

Figure 18B:
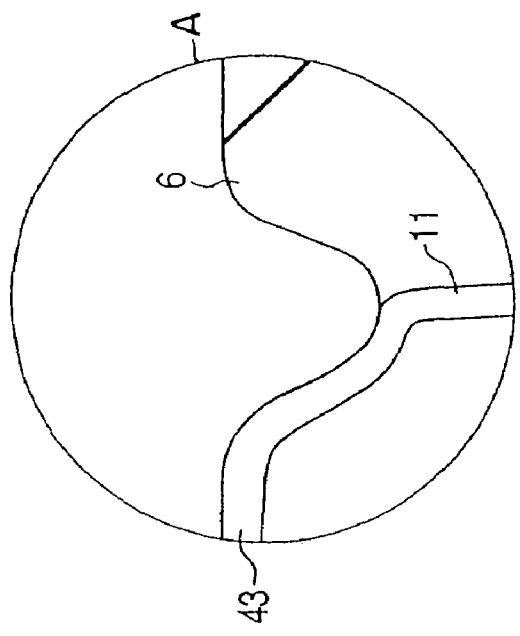
FIG. 18(b) is an enlarged view of the area A in FIG. 18(a)
Figure 18A:
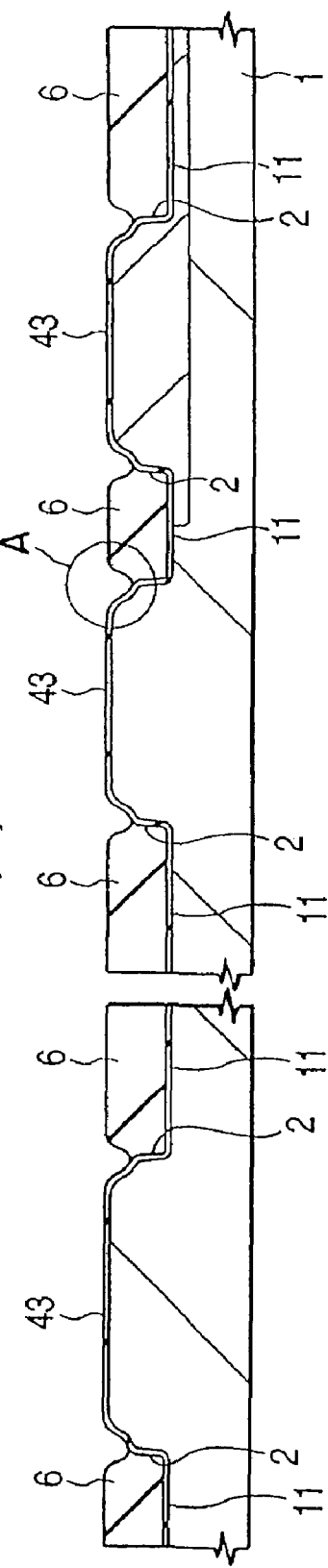
FIG. 18(a) is a sectional view of the key parts of the substrate showing the method of manufacturing a semiconductor integrated circuit device according to the embodiment of the present invention.

As shown in FIG. 18(a), the substrate 1 is thermally oxidized at about 850° C. to form a thin silicon oxide (fifth silicon oxide film) 43 having a thickness of about 10 nm on the surface of the substrate 1 of the active region L. This silicon oxide film 43 is formed to reduce the damage of the substrate 1 caused by striking the ions of an impurity which is carried in the following step.

Figure 19:
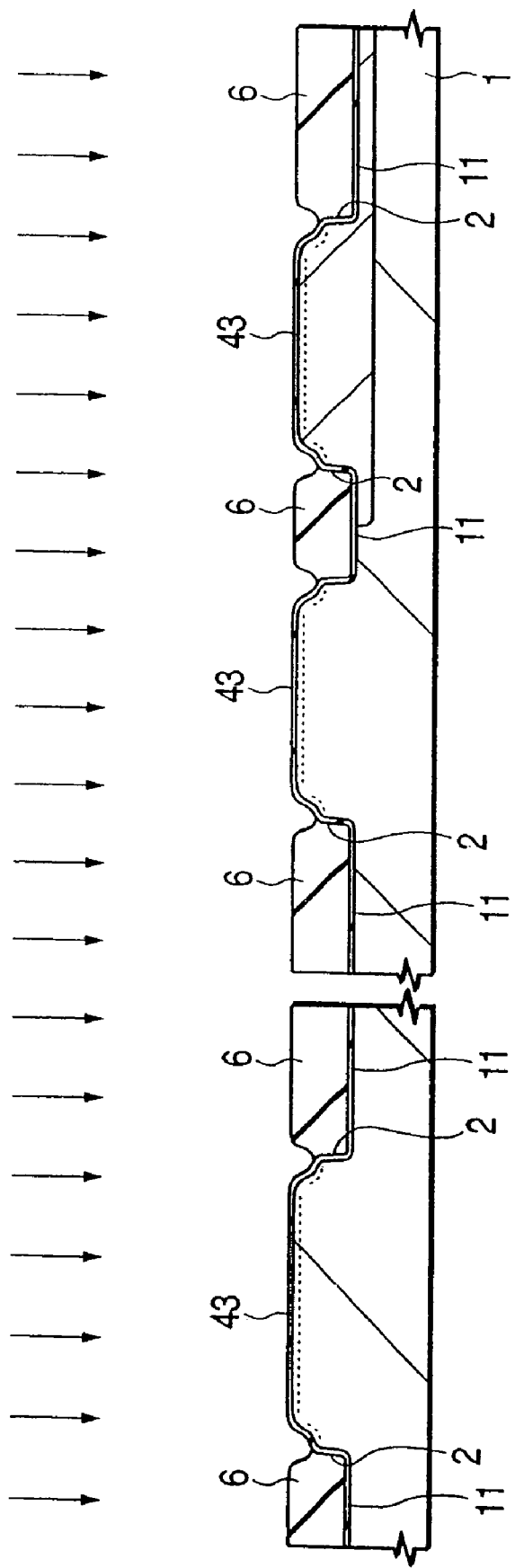
FIG. 19 is a sectional view of the key parts of the substrate showing the method of manufacturing a semiconductor integrated circuit device according to the embodiment of the present invention.

As shown in FIG. 19, an n type impurity (for example, phosphorus) is stricken into part of the substrate 1 through the silicon oxide film 43 and a p type impurity (boron) is stricken into another part to form wells (p type well 3 and n type wells 4 and 5). To form a channel region 12 in the substrate 1, a p type impurity (boron) is stricken into the substrate 1 through the above silicon oxide film 43. The impurity for forming the wells (p type well 3 and n type wells 4 and 5) is introduced into a deep region of the substrate 1 with high energy and the impurity for forming the channel region 12 is introduced into a shallow region of the substrate 1 with low energy.

The first sharply inclined surface ($S_1$) and the second gently inclined surface ($S_2$) both of which sandwich a rounded concave surface as shown in FIG. 4(*a*) and FIG. 4(*b*) are formed on the surface of the substrate 1 of the shoulder portion of the active region L by the steps up to this point. Therefore, as shown in the enlarged view of FIG. 20, the thickness ($t_0$) in a vertical direction of the silicon oxide film 43 on the first sharply inclined surface of the shoulder portion of the active region L is effectively larger than the thickness ($t_0$) of the silicon oxide film 43 in the center portion of the active region L. As a result, the concentration of the impurity for forming a channel introduced into the substrate 1 through the silicon oxide film 43 on the first inclined surface ($S_1$) becomes lower than the concentration of the impurity for forming a channel introduced into the substrate 1 of the center portion of the active region L.

Meanwhile, the thickness ($t_2$) in a vertical direction of the silicon oxide film 43 on the second inclined surface ($S_2$) near the side wall of the element isolation trench 2 is almost equal to the thickness ($t_0$) of the silicon oxide film 43 in the center portion of the active region L because its inclination is gentle. Therefore, the concentration of the impurity for forming a channel introduced into the substrate 1 through the silicon oxide film 43 on the second inclined surface ($S_2$) is almost equal to that in the center portion of the active region L.

Figure 21:
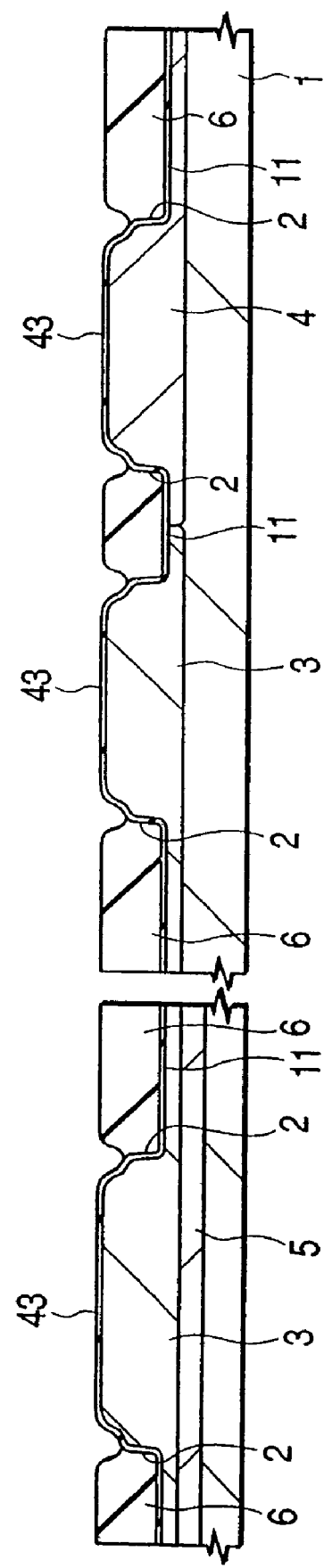
FIG. 21 is a sectional view of the key parts of the substrate showing the method of manufacturing a semiconductor integrated circuit device according to the embodiment of the present invention.

As shown in FIG. 21, the substrate 1 is heated at about 950° C. to spread and diffuse the above impurities so as to form a p type well 3 and an n type well 5 in the substrate 1 of a memory array and a p type well 3 and an n type well 4 in the substrate 1 of a peripheral circuit. The n type well 5 formed in a deep region of the substrate 1 of the memory array is formed to prevent noise from coming into the p type well 3 of the memory array from the peripheral circuit through the substrate 1.

A p type semiconductor region 12 constituting a channel is formed in the vicinity of the surface of the substrate 1 (p type well 3) of the memory array by the above heat treatment as shown in the enlarged view of FIG. 22. At this point, in the vicinity of the shoulder portion of the active region L, part of the impurity is diffused into the substrate 1 of the first inclined surface ($S_1$) from the substrate 1 of the second inclined surface ($S_2$) and the substrate 1 of the center portion of the active region L into which a larger amount of the impurity is introduced than the substrate 1 of the first inclined surface ($S_1$). Thereby, the concentration of the impurity in the p type semiconductor region 12 is almost made uniform in the center portion of the active region L, the first inclined surface ($S_1$) and the second inclined surface ($S_2$). Although not shown, the same channel region 12 as above is formed in the vicinity of the surface of the substrate 1 (p type well 3) of the peripheral circuit.

According to this embodiment, the concentration of the impurity in the p type semiconductor region 12 constituting a channel can be made almost uniform in the entire active region L. Thereby, the formation of a sub-channel in the shoulder portion of the active region can be suppressed and a reduction in threshold voltage can be prevented.

Figure 23:
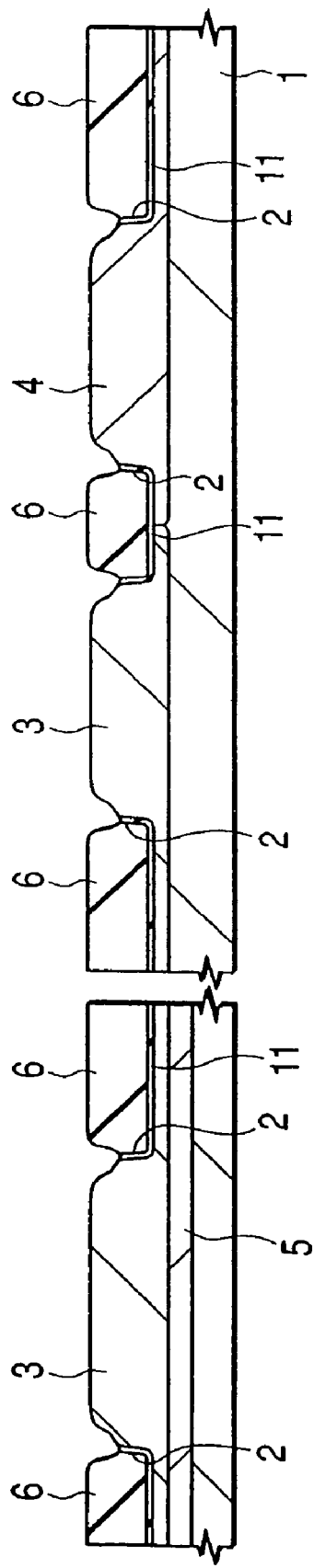
FIG. 23 is a sectional view of the key parts of the substrate showing the method of manufacturing a semiconductor integrated circuit device according to the embodiment of the present invention.
Figure 24:
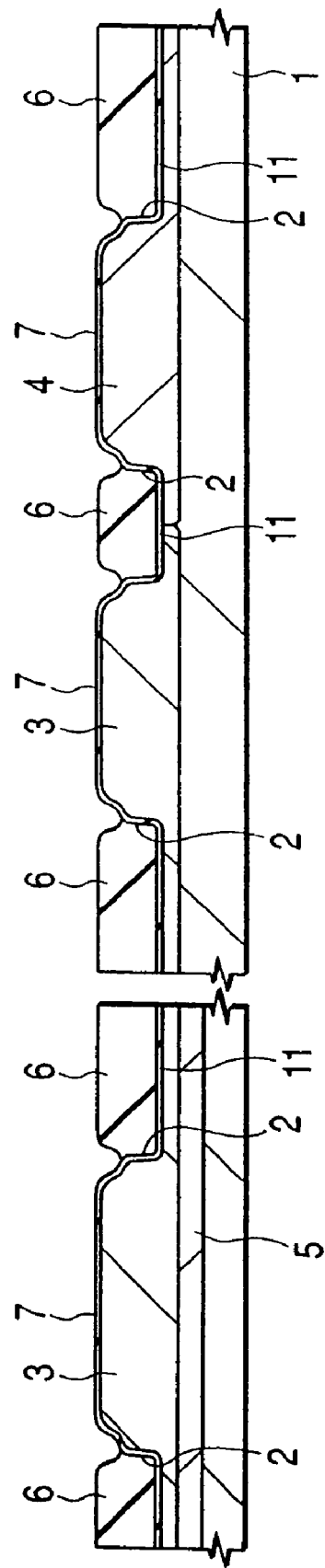
FIG. 24 is a sectional view of the key parts of the substrate showing the method of manufacturing a semiconductor integrated circuit device according to the embodiment of the present invention.

After the silicon oxide film 43 on the surface of the substrate 1 is removed by wet etching using hydrofluoric acid as shown in FIG. 23, the substrate 1 is thermally oxidized at about 800 to 850° C. to form a clean gate oxide film 7 having a thickness of about 4 nm on the surface as shown in FIG. 24. Since the gate oxide film 7 is formed on the shoulder portion of the active region L and the surface of the substrate 1 in the shoulder portion of the active region L is wholly rounded and has no angular portion as described above, the thickness of the gate oxide film 7 in this region becomes almost equal to the thickness of the gate oxide film 7 in the center portion of the active region.

Figure 25:
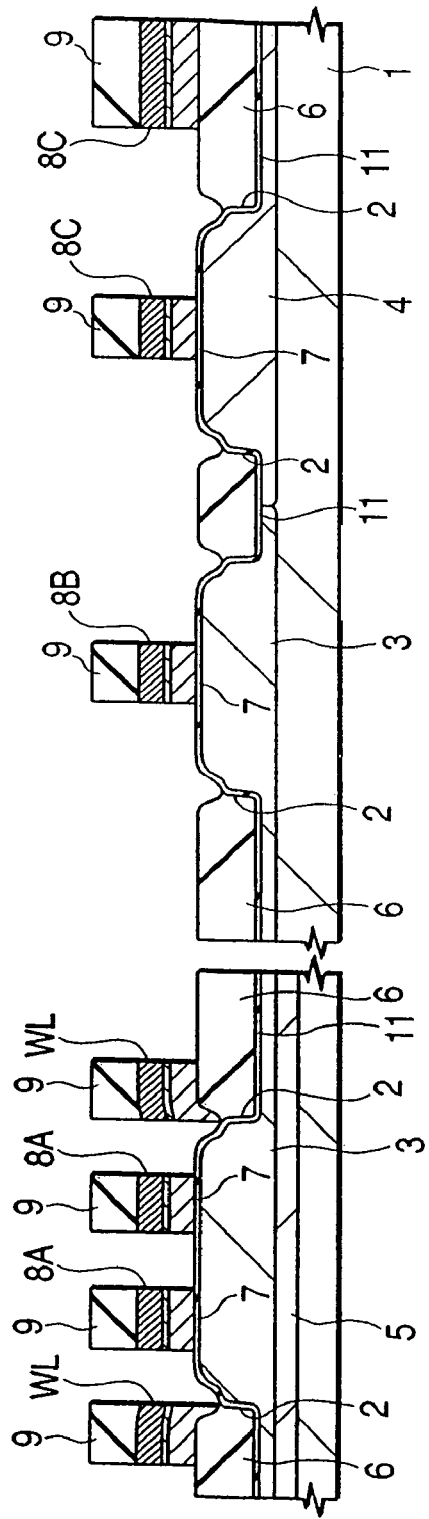
FIG. 25 is a sectional view of the key parts of the substrate showing the method of manufacturing a semiconductor integrated circuit device according to the embodiment of the present invention.

As shown in FIG. 25, gate electrodes 8A (word line WL), 8B and 8C are then formed on the top of the gate oxide film 7. The gate electrodes 8A (word line WL), 8B and 8C are formed, for example, by forming a polycrystal silicon film doped with phosphorus on the gate oxide film 7 by CVD, a WN film and a W film on the polycrystal silicon film by sputtering, a silicon nitride film 9 on these films by CVD and patterning these films by etching using a photoresist film (unshown) as a mask.

Figure 26:
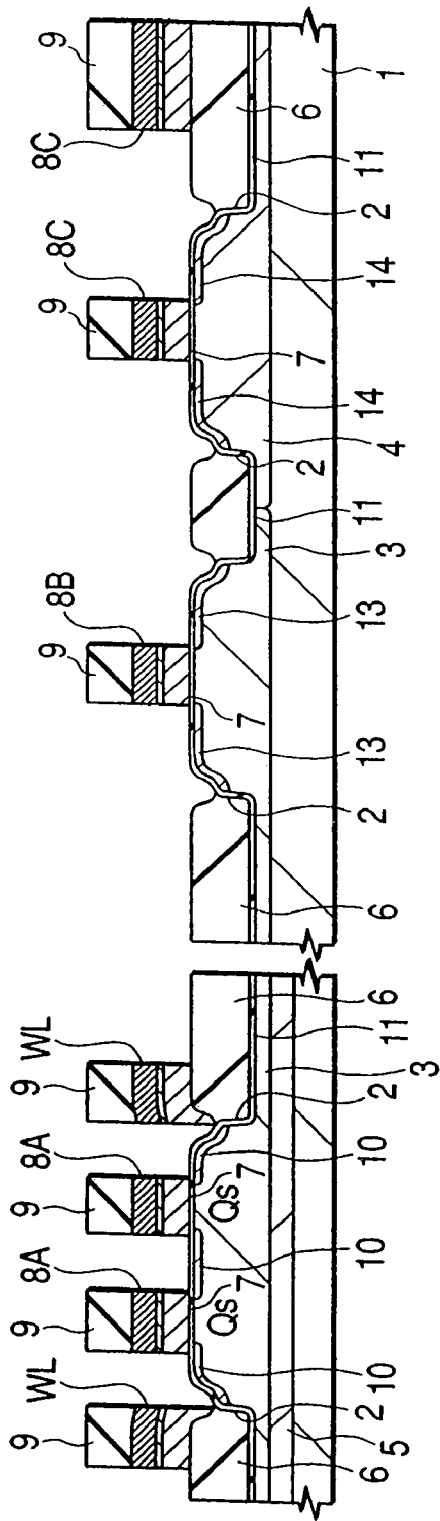
FIG. 26 is a sectional view of the key parts of the substrate showing the method of manufacturing a semiconductor integrated circuit device according to the embodiment of the present invention.

Thereafter, as shown in FIG. 26, an n type semiconductor region 12 constituting the source and drain of the MISFETQs for the selection of a memory cell is formed in the p type well 3 of the memory array and an n type semiconductor region 14 is formed in the p type well 3 of the peripheral circuit by injecting the ions of an n type impurity (phosphorus or arsenic) into the p type wells 3. Further, a p type semiconductor region 15 is formed by injecting the ions of a p type impurity (boron) into the n type well 4 of the peripheral circuit. The MISFETQs for the selection of a memory cell of a DRAM are substantially completed by the steps up to this point.

Figure 27:
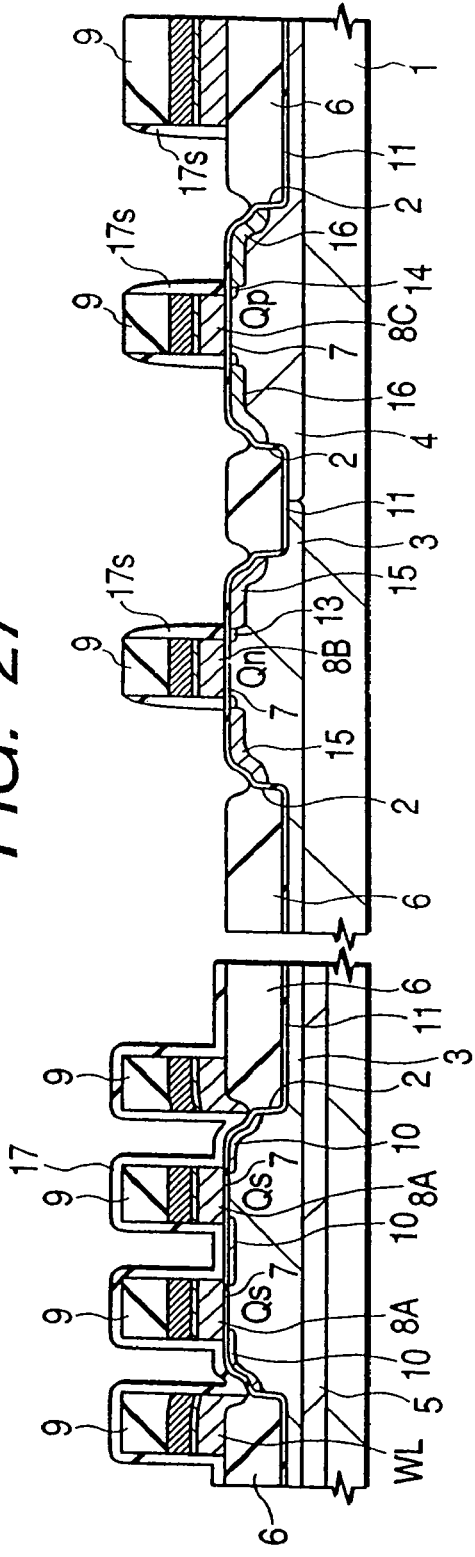
FIG. 27 is a sectional view of the key parts of the substrate showing the method of manufacturing a semiconductor integrated circuit device according to the embodiment of the present invention.

As shown in FIG. 27, a silicon nitride film 17 having a thickness of about 50 to 100 nm is formed on the substrate 1 by CVD, the silicon nitride film 17 of the memory array is covered with a photoresist film (unshown), and the silicon nitride film 17 of the peripheral circuit is etched anisotropically to form a side wall spacer 17c on the side walls of the gate electrodes 8B and 8C.

Subsequently, an $n^+$ type semiconductor region 11 (source and drain) having a high impurity concentration is formed by injecting the ions of an n type impurity (phosphorus) into the p type well 3 of the peripheral circuit and a $p^+$ type semiconductor region 12 (source and drain) having a high impurity concentration is formed by injecting the ions of a p type impurity (boron) into the n type well 4 of the peripheral circuit. The n channel MISFETQn and p channel MISFETQp of the peripheral circuit having a lightly doped drain structured source and drain are substantially completed by the steps up to this point.

Figure 28:
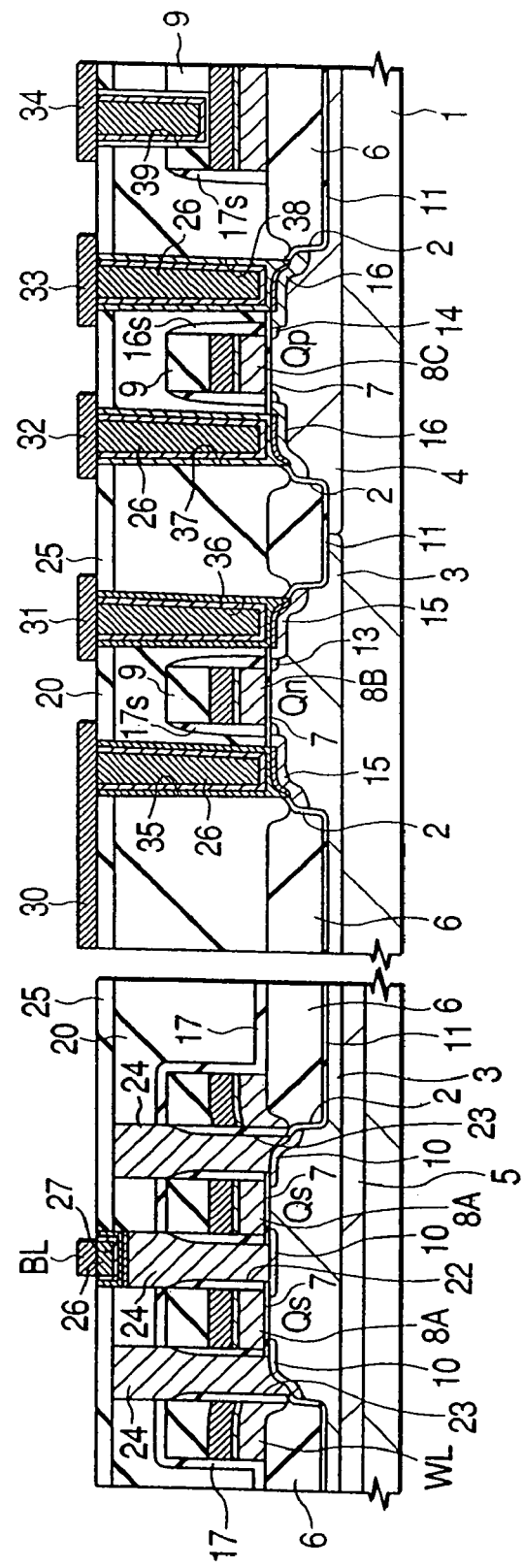
FIG. 28 is a sectional view of the key parts of the substrate showing the method of manufacturing a semiconductor integrated circuit device according to the embodiment of the present invention.

As shown in FIG. 28, a bit line BL is formed on the top of the MISFETQs for the selection of a memory cell and first layer wires 30 to 34 are formed on the top of the n channel MISFETQn and p channel MISFETQp of the peripheral circuit.

To form the bit line BL and the first layer wires 30 to 34, a silicon oxide film 20 having a thickness of about 600 nm is formed on the substrate 1 by CVD and is then polished by CMP to flatten the surface, and the silicon oxide film 20 and the silicon nitride film 17 overlying the source and drain (n type semiconductor region 10) of the MISFETQs for the selection of a memory cell are dry etched using a photoresist film (unshown) as a mask to form a contact hole 22 above one of the source and drain (n type semiconductor region 10) and a contact' hole 23 above the other.

A plug 24 is formed in the above contact holes 22 and 23. To form the plug 24, a polycrystal silicon film doped with an n type impurity (phosphorus) is formed on the silicon oxide film 20 containing the insides of the contact holes 22 and 23 and is etched back so that it remains only in the insides of the contact holes 22 and 23.

Thereafter, a silicon oxide film 25 having a thickness of about 200 nm is formed on the above silicon oxide film 20 by CVD and the silicon oxide film 25 of the memory array is dry etched using a photoresist film (unshown) as a mask to form a through hole 27 above the contact hole 22. The silicon oxide film 25 and the underlying silicon oxide film 20 of the peripheral circuit are dry etched using a photoresist film (unshown) as a mask to form contact holes 35 and 36 above the source and drain (n$^+$ type semiconductor region 15) of the n channel MISFETQn, and the silicon oxide film 25, the underlying silicon oxide film 20 and silicon nitride layer 9 overlying the gate electrode 8C of the peripheral circuit are dry etched to form contact holes 37 and 38 above the source and drain (p$^+$ type semiconductor region 12) of the p channel MISFETQp and a contact hole 39 above the gate electrode 8C.

A plug 26 is then formed in the contact holes 35 to 39 and the through hole 27. To form the plug 26, a Co film (or Ti film) is formed on the silicon oxide film 25 containing the insides of the contact holes 35 to 39 and the inside of the through hole 27 by sputtering, a TiN film and a W film are formed on the Co film (or Ti film) by CVD, and the W film, TiN film and Co film (or Ti film) formed on the silicon oxide film 25 are polished by CMP so that these films remain only in the insides of the contact holes 35 to 39 and the through hole 27.

After a W film having a thickness of about 200 nm is formed on the silicon oxide film 25 by sputtering, the W film is dry etched using a photoresist film (unshown) as a mask to form a bit line BL and first layer wires 30 to 34 of the peripheral circuit.

Figure 29:
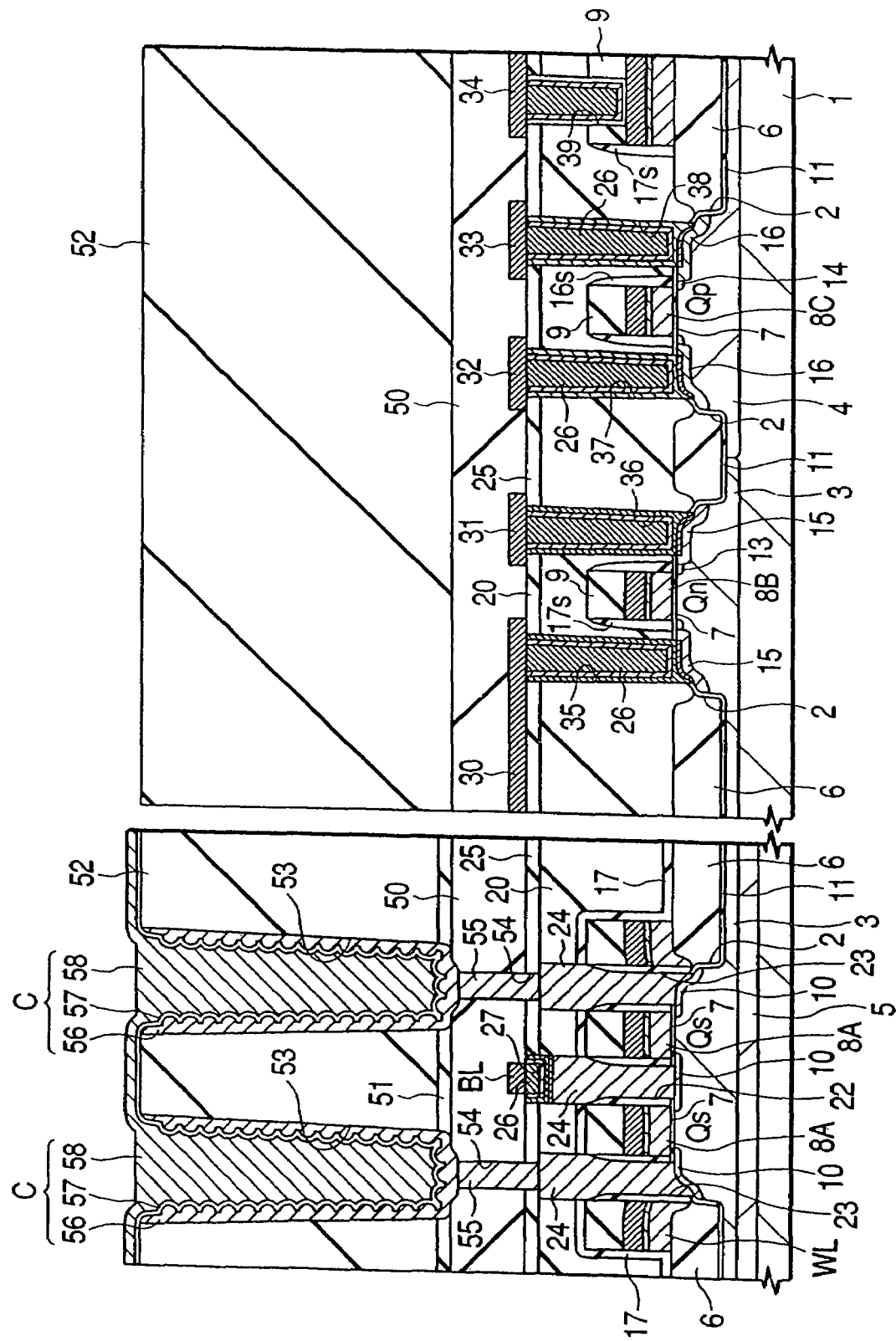
FIG. 29 is a sectional view of the key parts of the substrate showing the method of manufacturing a semiconductor integrated circuit device according to the embodiment of the present invention.
Figure 30:
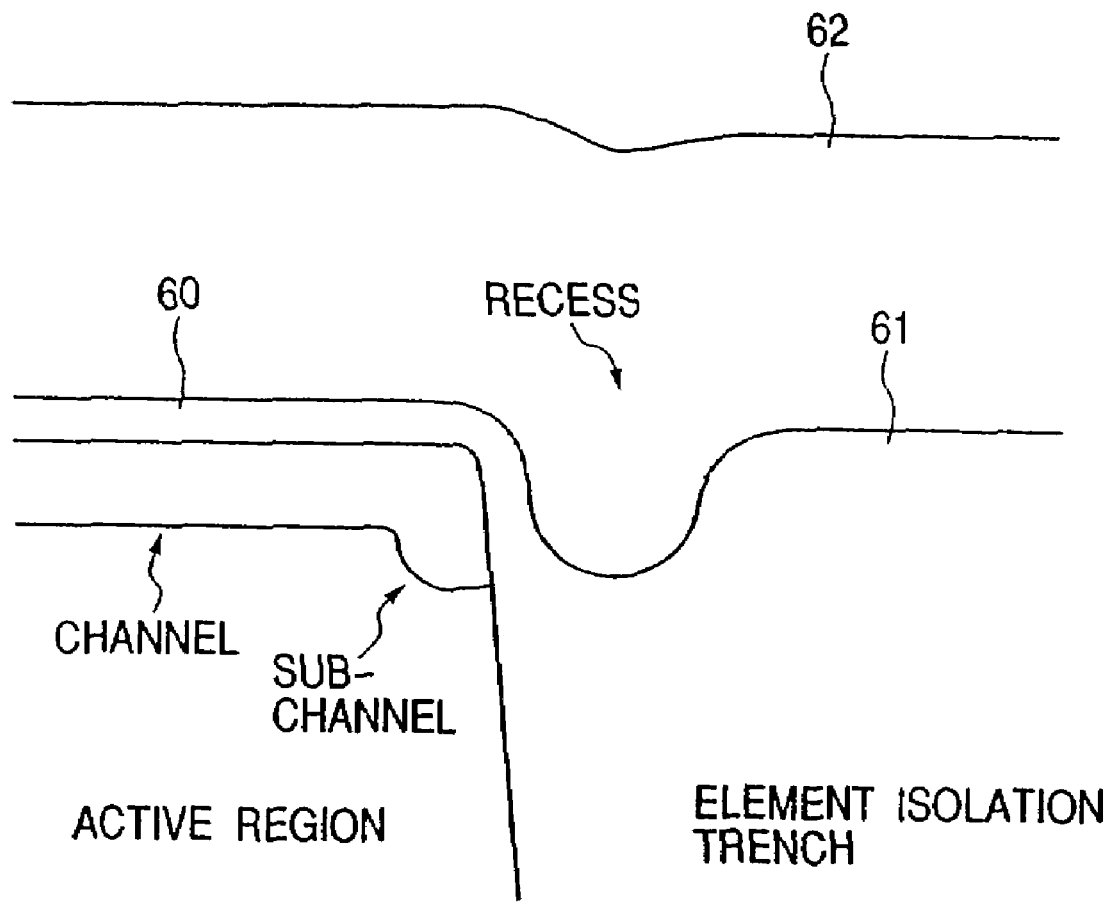
FIG. 30 is an enlarged view of the shoulder portion of the active region and therearound in the element isolation structure studied by the present inventor.

As shown in FIG. 29, an information storage capacitor element C for a memory cell is then formed above the bit line BL.

To form the information storage capacitor element C, a silicon oxide film 50 having a thickness of about 300 nm is first formed on the bit line BL and the first layer wires 30 to 34 by CVD and the silicon oxide film 50 and the underlying silicon oxide film 25 are dry etched to form a through hole 55 above the contact hole 23.

After a plug 55 is formed in the through hole 54, a silicon nitride film 51 having a thickness of about 100 nm is formed on the silicon oxide film 50 by CVD and then the silicon nitride film 51 of the peripheral circuit is removed by etching using a photoresist film (unshown) as a mask. To form the plug 55, a polycrystal silicon film doped with an n type impurity (phosphorus) is formed on the silicon oxide film 50 containing the inside of the through hole 54 and is then etched back so that it remains only in the inside of the through hole 54.

A silicon oxide film 52 is formed on the silicon nitride film 51 of the memory array and the silicon oxide film 50 of the peripheral circuit by CVD, the silicon oxide film 52 of the memory array is then dry etched using a photoresist film (unshown) as a mask, and the silicon nitride film 51 underlying the silicon oxide film 52 is dry etched to form a trench 53 above the through hole 54. Since the lower electrode 56 of the information storage capacitor element C is formed on the inner wall of the trench 53, the silicon oxide film 52 must be formed thick (for example, about 1.3 μm) and the deep trench 53 must be formed to increase the amount of stored charge by increasing the surface area of the lower electrode 56.

After an amorphous silicon film (unshown) having a thickness of about 50 nm doped with an n type impurity (phosphorus) is formed on the silicon oxide film 52 containing the inside of the above trench 53 by CVD, the amorphous silicon film overlying the silicon oxide film 52 is removed by etching back so that the amorphous silicon film remains on the inner wall of the trench 53. Thereafter, the surface of the above amorphous silicon film remaining in the inside of the trench 53 is washed with a hydrofluoric acid-based etching solution, nionosilane (SiH$_4$) is supplied onto the surface of the amorphous silicon film in a reduced pressure atmosphere, and the substrate 1 is heated to polycrystallize the amorphous silicon film and to grow silicon particles on the surface. Thereby, the lower electrode 56 formed of the polycrystal silicon film having a roughened surface is formed on the inner wall of the trench 53.

Thereafter, a capacitor insulating film 57 formed of a tantalum oxide film and an upper electrode 58 formed of a TiN film are formed on the lower electrode 56. To form the capacitor insulating film 57 and the upper electrode 58, the tantalum oxide film having a thickness of about 20 nm is formed on the silicon oxide film 52 containing the inside of the trench 53 by CVD, the TiN film having a thickness of about 150 nm is then formed on the tantalum oxide film by CVD and sputtering, and the TiN film and the tantalum oxide film are dry etched using a photoresist film (unshown) as a mask. Thereby, the information storage capacitor element C consisting of the lower electrode 56 formed of the polycrystal silicon film, the capacitor isolating film 57 formed of the tantalum oxide film and the upper electrode 58 formed of the TiN film is formed. The memory cells of a DRAM composed of the MISFETQs for the selection of a memory cell and the information storage capacitor elements C connected in series to the MISFETQs are completed by the steps up to this point.

Thereafter, about two layers consisting of an Al wiring layer and a surface protective layer for protecting the wire layer are formed on the information storage capacitor elements C, though they are not shown.

The invention made by the present inventor has been described with reference to preferred embodiments thereof. However, it is needless to say that the present invention is not limited to these preferred embodiments and that various changes and modifications can be made without departing from the spirit and scope of the invention.

Although the present invention is applied to a DRAM in the above embodiments, the present invention is not limited to this. The present invention can be widely applied to various SLSIs for forming fine MISFETs on a substrate having element isolation trenches.

Effects obtained by the present invention will be described herein under.

According to the present invention, since the formation of a sub-channel in the shoulder portion of the active region can be suppressed, a reduction in the threshold voltage of a fine MISFET can be prevented. Thereby, the concentration of an impurity in the substrate can be reduced and hence, the improvement of refresh characteristics by a reduction in leakage current can be realized in the case of a DRAM.

Further, according to the present invention, since the concentration of a field upon the shoulder portion of the active region and a reduction in the thickness of the gate insulating film can be prevented by rounding the shoulder portion of the active region, a reduction in threshold voltage caused by these can be prevented.

What is claimed is:

1. A method of manufacturing a semiconductor integrated circuit device comprising steps of:
    (a) forming a first silicon oxide film over a surface of a semiconductor substrate by thermally oxidizing said substrate and then forming an oxidation resistant film over said first silicon oxide film, and selectively exposing said surface of said substrate for an element isolation region by removing said oxidation resistant film and said first silicon oxide film;
    (b) after said step (a), recessing an end of said first silicon oxide film inward more than an end of said oxidation resistant film;
    (c) forming a second silicon oxide film, having a thickness larger than that of said first silicon oxide film, on said surface of said substrate which is exposed after said step (b) by thermally oxidizing said exposed substrate surface including a silicon surface extending from an edge of said first silicon oxide film and under said oxidation resistant film, said second silicon oxide film including a bird's beak that extends inwardly from the end of said oxidation resistant film;
    (d) exposing said surface of said semiconductor substrate in said element isolation region by etching said second silicon oxide film, including said bird's beak, to form an inclined surface of said substrate at an edge of said element isolation region, wherein said edge of said element isolation region extends inwardly from the end of said oxidation resistant film;
    (e) forming a trench in said substrate of said element isolation region by etching said substrate exposed in said step (d) to form a concave surface at said edge of said element isolation region, using said oxidation resistant film as a mask;
    (f) after said step (e), cleaning said substrate;
    (g) after said step (f), rounding said edge of said element isolation region by thermal oxidation; and
    (h) after said step (g), burying said trench with an insulating film by polishing an insulating film formed over said oxidation resistant film and said trench.

2. A method according to claim 1, wherein said concave surface is formed by a recessing of an intermediate portion of said inclined surface in said step (d).

3. A method according to claim 1, wherein a third silicon oxide film is formed on an inner wall of said trench by said thermal oxidation in said step (g).

4. A method according to claim 1, wherein said substrate is over-etched in said removing of said step (a).

5. A method of manufacturing a semiconductor integrated circuit device comprising steps of:
    (a) forming a first silicon oxide film over a surface of a semiconductor substrate by thermally oxidizing said substrate and then forming an oxidation resistant film over said first silicon oxide film, and selectively exposing said surface of said substrate for an element isolation region by removing said oxidation resistant film and said first silicon oxide film;
    (b) after said step (a), recessing an end of said first silicon oxide film inward more than an end of said oxidation resistant film;
    (c) forming a second silicon oxide film, having a thickness larger than that of said first silicon oxide film, on said surface of said substrate which is exposed after said step (b) by thermally oxidizing said exposed substrate surface including a silicon surface extending from an edge of said first silicon oxide film and under said oxidation resistant film, said second silicon oxide film including a bird's beak that extends inwardly from the end of said oxidation resistant film;
    (d) exposing said surface of said semiconductor substrate in said element isolation region by etching said second silicon oxide film, including said bird's beak, to form an inclined surface of said substrate at an edge of said element isolation region, wherein said edge of said element isolation region extends inwardly from the end of said oxidation resistant film;
    (e) forming a trench in said substrate of said element isolation region by etching said substrate exposed in said step (d) to form a concave surface at said edge of said element isolation region, using said oxidation resistant film as a mask;
    (f) after said step (e), rounding said edge of said element isolation region by thermal treatment; and
    (g) after said step (f), burying said trench with an insulating film by polishing an insulating film formed over said oxidation resistant film and said trench.

6. A method according to claim 5, wherein said concave surface is formed by a recessing of an intermediate portion of said inclined surface in said step (d).

7. A method according to claim 5, wherein a third silicon oxide film is formed on an inner wall of said trench by said thermal treatment in said step (f).

8. A method according to claim 5, wherein said substrate is over-etched in said removing of said step (a).

9. A method of manufacturing a semiconductor integrated circuit device comprising steps of:
    (a) forming a first silicon oxide film over a surface of a semiconductor substrate by thermally oxidizing said substrate and then forming an oxidation resistant film over said first silicon oxide film, selectively exposing said surface of said substrate for an element isolation region by removing said oxidation resistant film and said first silicon oxide film, and then over-etching the semiconductor substrate that is exposed;
    (b) forming a second silicon oxide film, having a thickness larger than that of said first silicon oxide film, on said surface of said substrate which is exposed after said step (a) by thermally oxidizing said exposed substrate surface including a silicon surface extending from an edge of said first silicon oxide film and under said oxidation resistant film, said second silicon oxide film including a bird's beak that extends inwardly from the end of said oxidation resistant film;
    (c) exposing said surface of said semiconductor substrate in said element isolation region by etching said second silicon oxide film, including said bird's beak, to form an inclined surface of said substrate at an edge of said element isolation region, wherein said edge of said element isolation region extends inwardly from the end of said oxidation resistant film;
    (d) forming a trench in said substrate of said element isolation region by etching said substrate exposed in said step (d) to form a concave surface at said edge of said element isolation region, using said oxidation resistant film as a mask;
    (e) after said step (d), rounding said edge of said element isolation region by thermal treatment whereby a first sharply inclined surface and a second gently inclined surface are formed at said edge of said element isolation region, such that said second gently inclined surface is formed between said first sharply inclined surface and an inner wall of said trench; and (f) after said step (e), burying said trench with an insulating film by polishing an insulating film formed over said oxidation resistant film and said trench.

10. A method according to claim 9, further comprising the step of:

between said step (a) and said step (b), recessing an end of said first silicon oxide film inward more than an end of said oxidation resistant film.

11. A method according to claim 9, wherein said concave surface is formed by a recessing of an intermediate portion of said inclined surface in said step (c).

12. A method according to claim 9, wherein a third silicon oxide film is formed on said inner wall of said trench by said thermal oxidation in said step (e).

13. A method of manufacturing a semiconductor integrated circuit device comprising steps of:

(a) forming a first silicon oxide film over a semiconductor substrate;

(b) forming a first silicon nitride film over said first silicon oxide film;

(c) selectively etching said first silicon nitride film and said first silicon oxide film and over-etching said semiconductor substrate;

(d) recessing an end of said first silicon oxide film inward more than an end of said first silicon nitride film;

(e) forming a second silicon oxide film over the etched semiconductor substrate, after said step (c), wherein said second silicon oxide film extends inward from the end of said first silicon nitride film, and wherein an inwardly extended second silicon oxide film is formed on an etched surface of said semiconductor substrate including a silicon surface, extending from adjacent an edge of said first silicon oxide film and under said first silicon nitride film;

(f) forming an inclined surface in said semiconductor substrate by etching said second silicon oxide film, wherein an edge of said inclined surface extends inwardly from the end of said first silicon nitride film;

(g) etching said semiconductor substrate to form a trench by using said first silicon nitride film as a mask;

(h) rounding a first boundary portion between said inclined surface and a surface of said semiconductor substrate, and a second boundary portion between said inclined surface and a sidewall of said trench; and (i) burying an insulating film in said trench.

14. A method of manufacturing a semiconductor integrated circuit device according to claim 13, further comprising a step of:

(j) between said steps (g) and (h), washing said substrate.

15. A method of manufacturing a semiconductor integrated circuit device according to claim 13, wherein a method of thermal oxidation is used for said step (h).

16. A method of manufacturing a semiconductor integrated circuit device according to claim 13, wherein at said step (h), a third silicon oxide film is formed over an inner wall of said trench.

17. A method of manufacturing a semiconductor integrated circuit device according to claim 16, further comprising a step of forming a second silicon nitride film over said inner wall of said trench.

18. A method of manufacturing a semiconductor integrated circuit device according to claim 13, wherein said step (i) comprises steps of:

(k) forming an insulating film over said first silicon nitride film and inside said trench; and (l) polishing said insulating film by a CMP method.

19. A method of manufacturing a semiconductor integrated circuit device according to claim 18, wherein at said step (l), said first silicon nitride film is used as an etching stopper.

20. A method of manufacturing a semiconductor integrated circuit device according to claim 18, further comprising a step of:

(m) after said step (k), annealing said insulating film.

21. A method of manufacturing a semiconductor integrated circuit device according to claim 13, further comprising a step of:

(n) after said step (i), introducing impurities into said semiconductor substrate to control threshold voltage of a MISFET.

22. A method of manufacturing a semiconductor integrated circuit device according to claim 13, wherein said second silicon oxide film has a thickness larger than that of said first silicon oxide film.

23. A method of manufacturing a semiconductor integrated circuit device comprising steps of:

(a) forming a first insulating film over a semiconductor substrate;

(b) forming an oxidation resistant film over said first insulating film;

(c) selectively exposing said semiconductor substrate by etching said oxidation resistant film and said first insulating film, wherein said semiconductor substrate is over-etched at said step (c);

(d) forming a second insulating film over said semiconductor substrate exposed after said step (c), wherein said second insulating film extends inward from an end portion of said oxidation resistant film, and wherein an inwardly extended second silicon oxide film is formed on an etched surface of the semiconductor substrate including a silicon surface, extending from adjacent an edge of said first insulating film and under said oxidation resistant film;

(e) forming an inclined surface in said semiconductor substrate by etching said second insulating film, wherein an edge of said inclined surface extends inwardly from the end portion of said oxidation resistant film;

(f) etching said semiconductor substrate to form a trench, using said oxidation resistant film as a mask;

(g) rounding a first boundary portion between said inclined surface and a surface of said semiconductor substrate, and a second boundary portion between said inclined surface and a sidewall of said trench; and (h) burying a third insulating film in said trench.

24. A method of manufacturing a semiconductor integrated circuit device according to claim 23, further comprising a step of:

(i) between said steps (c) and (d), recessing an end of said first insulating film inward more than an end of said oxidation resistant film.

25. A method of manufacturing a semiconductor integrated circuit device according to claim 23, further comprising a step of:

(j) between said steps (f) and (g), washing said substrate.

26. A method of manufacturing a semiconductor integrated circuit device according to claim 23, wherein a method of thermal oxidation is used for said step (g).

27. A method of manufacturing a semiconductor integrated circuit device according to claim 23, wherein at said step (g), a fourth silicon oxide film is formed over an inner wall of said trench.

28. A method of manufacturing a semiconductor integrated circuit device according to claim 27, further comprising a step of forming a silicon nitride film over said inner wall of said trench.

29. A method of manufacturing a semiconductor integrated circuit device according to claim 23, wherein said step (h) comprises steps of:
(k) forming an insulating film over said oxidation resistant film and inside said trench; and
(l) polishing said insulating film by a CMP method.

30. A method of manufacturing a semiconductor integrated circuit device according to claim 29, wherein at said step (l), said oxidation resistant film is used as an etching stopper.

31. A method of manufacturing a semiconductor integrated circuit device according to claim 29, further comprising a step of:
(m) after said step (k), annealing said insulating film formed in step (k).

32. A method of manufacturing a semiconductor integrated circuit device according to claim 23, further comprising a step of:
(n) after said step (h), introducing impurities into said semiconductor substrate to control threshold voltage of a MISFET.

33. A method of manufacturing a semiconductor integrated circuit device according to claim 23, wherein said second insulating film has a thickness larger than that of said first insulating film.

34. A method of manufacturing a semiconductor integrated circuit device according to claim 23, wherein the over-etching of the semiconductor substrate at the step (c) is an amount of about 10 to 30 nm.

35. A method of manufacturing a semiconductor integrated circuit device comprising steps of:
(a) forming a first insulating film over a semiconductor substrate;
(b) forming an oxidation resistant film over said first insulating film;
(c) selectively etching said oxidation resistant film and said first insulating film, wherein said semiconductor substrate is over-etched at said step (c);
(d) forming bird's beaks in said semiconductor substrate by a thermal oxidation method, wherein said bird's beaks extend under said oxidation resistant film, by oxidizing a silicon surface adjacent an edge of said first insulating film and extending under said oxidation resistant film;
(e) forming an inclined surface in said semiconductor substrate by removing said bird's beaks, wherein an edge of said inclined surface extends inwardly from an end of said oxidation resistant film;
(f) etching said semiconductor substrate to form a trench after step (e), using said oxidation resistant film as a mask;
(g) rounding a first boundary portion between said inclined surface and a surface of said semiconductor substrate, and a second boundary portion between said inclined surface and a sidewall of said trench; and
(h) burying a third insulating film in said trench.

36. A method of manufacturing a semiconductor integrated circuit device according to claim 35, further comprising a step of:
(i) between said steps (c) and (d), recessing an end of said first insulating film inward more than an end of said oxidation resistant film.

37. A method of manufacturing a semiconductor integrated circuit device according to claim 35, further comprising a step of:
(j) between said steps (f) and (g), washing said substrate.

38. A method of manufacturing a semiconductor integrated circuit device according to claim 35, wherein a method of thermal oxidation is used for said step (g).

39. A method of manufacturing a semiconductor integrated circuit device according to claim 35, wherein at said step (g), a fourth silicon oxide film is formed over an inner wall of said trench.

40. A method of manufacturing a semiconductor integrated circuit device according to claim 39, further comprising a step of forming a silicon nitride film over said inner wall of said trench.

41. A method of manufacturing a semiconductor integrated circuit device according to claim 35, wherein said step (h) comprises steps of:
(k) forming an insulating film over said oxidation resistant film and inside said trench; and
(l) polishing said insulating film by a CMP method.

42. A method of manufacturing a semiconductor integrated circuit device according to claim 41, wherein at said step (l), said oxidation resistant film is used as an etching stopper.

43. A method of manufacturing a semiconductor integrated circuit device according to claim 41, further comprising a step of:
(m) after said step (k), annealing said insulating film formed in said step (k).

44. A method of manufacturing a semiconductor integrated circuit device according to claim 35, further comprising a step of:
(n) after said step (h), introducing impurities into said semiconductor substrate to control threshold voltage of a MISFET.

45. A method of manufacturing a semiconductor integrated circuit device according to claim 35, wherein in step (d) a second insulating film is formed, and said second insulating film has a thickness larger than that of said first insulating film.

46. A method of manufacturing a semiconductor integrated circuit device according to claim 35, wherein the over-etching of the semiconductor substrate at the step (c) is an amount of about 10 to 30 nm.

* * * * *